United States Patent
Sugimura et al.

(10) Patent No.: US 7,518,261 B2
(45) Date of Patent: *Apr. 14, 2009

(54) METHOD OF DIAGNOSING MAIN RELAY BY USE OF ELECTRONIC CONTROL UNIT AND ELECTRONIC CONTROL UNIT

(75) Inventors: Atsushi Sugimura, Kariya (JP); Hideki Iwatsuki, Anjo (JP)

(73) Assignee: DENSO Corporation, Kariya (JP)

( * ) Notice: Subject to any disclaimer, the term of this patent is extended or adjusted under 35 U.S.C. 154(b) by 269 days.

This patent is subject to a terminal disclaimer.

(21) Appl. No.: 11/430,908

(22) Filed: May 10, 2006

(65) Prior Publication Data

US 2006/0256497 A1 Nov. 16, 2006

(30) Foreign Application Priority Data

May 10, 2005 (JP) ............................. 2005-137724

(51) Int. Cl.
*B60R 22/00* (2006.01)
(52) U.S. Cl. ..................................... 307/10.6
(58) Field of Classification Search ................. 307/10.6
See application file for complete search history.

(56) References Cited

U.S. PATENT DOCUMENTS

| 5,575,265 | A | 11/1996 | Kurihara et al. |
| 2004/0047097 | A1 | 3/2004 | Jordan et al. |
| 2005/0021304 | A1 | 1/2005 | Hirashima |
| 2005/0187681 | A1 | 8/2005 | Suzuki et al. |
| 2006/0259209 | A1* | 11/2006 | Sugimura ...................... 701/1 |

FOREIGN PATENT DOCUMENTS

| JP | 5-126920 | 5/1993 |
| JP | 8-35452 | 2/1996 |
| JP | 2000-65691 | 3/2000 |
| JP | 2003-254172 | 9/2003 |
| JP | 2005-23843 | 1/2005 |
| JP | 2005-226488 | 8/2005 |
| JP | 2005-226494 | 8/2005 |
| JP | 2005-301615 | 10/2005 |

OTHER PUBLICATIONS

Communication dated Jun. 4, 2008 issued in corresponding European Application No. 06 009 698.9.
EPO Search Report dated Jul. 4, 2006.

* cited by examiner

*Primary Examiner*—Robert L. Deberadinis
(74) *Attorney, Agent, or Firm*—Nixon & Vanderhye P.C.

(57) ABSTRACT

The electronic control unit includes a control section monitoring a manipulation of an ignition switch of a vehicle and a timer section for automatically starting up said control section. The electronic control unit is provided with a fault diagnosis function of monitoring, by use of the control section, a state of an electric load connected to said electronic control unit and supplied with electric power from the vehicle battery when the main relay is in the on state after the control section outputs the stop command, and diagnosing whether or not the main relay is in a fault state where the main relay cannot be controlled from the on state to the off state on the basis of monitored state of the electric load.

25 Claims, 16 Drawing Sheets

METHOD OF DIAGNOSING MAIN RELAY BY USE OF ELECTRONIC CONTROL UNIT AND ELECTRONIC CONTROL UNIT

CROSS-REFERENCE TO RELATED APPLICATION

This application is related to Japanese Patent Application No. 2005-137724 filed on May 10, 2005, the contents of which are hereby incorporated by reference.

BACKGROUND OF THE INVENTION

1. Field of the Invention

The present invention relates to a method of diagnosing presence of a fault in a main relay used for controlling supply of electric power to electric loads such as a microcomputer of an electronic control unit and various actuators mounted on a vehicle, and relates to an electronic control unit having a function of performing a fault diagnosis on such a main relay.

2. Description of Related Art

Most engine systems mounted on vehicles are provided with a self-diagnosis function. Such engine systems are configured to perform a self-diagnosis during a period when a vehicle engine is in a state where there is no fear of making a wrong diagnosis.

However, it often occurs that the time during which the vehicle engine is kept at the state where there is no fear of making a wrong diagnosis is too short to perform the self-diagnosis, depending on the contents of the self-diagnosis (diagnosis targets). One of such diagnosis targets is the evapo-purge system described, for example, in Japanese Patent Application Laid-open No. 8-35452.

The evapo-purge system is a system for collecting fuel steam evaporating from a fuel tank into a canister, and purging the collected fuel steam into an air intake passage of a vehicle engine together with fresh air sucked through an atmospheric hole of the canister depending on a running state of the vehicle engine. The evapo-purge system is mainly constituted by the canister, an evapo-passage for communication between the fuel tank and the canister, and a purge passage for communication between the canister and the air intake passage. To diagnose the evapo-purge system, the system is set in a closed state, and then a certain pressure is applied to the inside of this system. Abnormality in the evapo-purge system, that is, leakage due to a hole or a crack (mainly in the evapo-passage or the purge passage) can be detected by monitoring how the pressure inside the system varies when the application of the pressure to the inside of this system is removed.

If the fuel in the fuel tank is vibrated, or if the temperature of the fuel changes while the self-diagnosis is performed, the abnormality detection reliability may be degraded, because the fuel vibration and the fuel temperature change have a nonnegligible effect on the pressure inside the system.

Accordingly, it is known to configure an electronic control unit having a function of performing a self-diagnosis such that it automatically restarts in order to perform the self-diagnosis after a lapse of a predetermined time from the time when an ignition switch was turned off to stop a vehicle engine (refer to Japanese Patent Application Laid-open No. 2003-254172, for example).

Such an electronic control unit includes therein a soak timer. When the soak timer in which a predetermined timer time (start-up set time) is set is timed-up, a main relay is energized (turned on), as a result of which electric power is supplied to a microcomputer of the electronic control unit so that the electronic control unit can perform the self-diagnosis.

In such an electronic control unit, if the main relay develops a fault in that the main relay is always in the on state due to abnormality in a relay drive circuit, or the soak timer, or the main relay itself, it may result that the remaining capacity of a vehicle battery keeps decreasing and runs out at the worst time, because the supply of electric power to the electronic control unit continues.

SUMMARY OF THE INVENTION

The present invention provides a method of diagnosing presence of a fault in a main relay by use of an electronic control unit including a control section monitoring a manipulation of an ignition switch of a vehicle, and a timer section for automatically starting up the control section, the electronic control unit being configured to control the main relay to an on state for supplying the control section with electric power from a vehicle battery when the ignition switch is turned on or when the timer section in which a predetermined start-up set time is set is timed up, and to control the main relay to an off state in accordance with a stop command outputted from the control section, the method including the steps of:

monitoring, by use of the control section, a state of an electric load connected to the electronic control unit and supplied with electric power from the vehicle battery when the main relay is in the on state after the control section outputs the stop command; and diagnosing whether or not the main relay is in a fault state where the main relay cannot be controlled from the on state to the off state on the basis of monitored state of the electric load.

The present invention also provides An electronic control unit including:

a control section monitoring a manipulation of an ignition switch of a vehicle; and a timer section for automatically starting up the control section;

the electronic control unit being configured to control the main relay to an on state for supplying the control section with electric power from a vehicle battery when the ignition switch is turned on or when the timer section in which a predetermined start-up set time is set is timed up, and to control the main relay to an off state in accordance with a stop command outputted from the control section, and being provided with a fault diagnosis function of monitoring, by use of the control section, a state of an electric load connected to the electronic control unit and supplied with electric power from the vehicle battery when the main relay is in the on state after the control section outputs the stop command, and diagnosing whether or not the main relay is in a fault state where the main relay cannot be controlled from the on state to the off state on the basis of monitored state of the electric load.

The fault diagnosis function may be configured to make an attempt to drive the electric load by use of the control section to monitor an operation state of the electric load when the attempt is made.

The stop command outputted from the control section may be inputted to a drive circuit of the main relay by way of the timer section, and the fault diagnosis function may be configured to make the attempt utilizing a time period after transmission of the stop command from the control section to the timer section.

The stop command outputted from the control section may be directly inputted to a drive circuit of the main relay, and the fault diagnosis function may be configured to make the attempt utilizing a time period after transmission of the stop command from the control section to a drive circuit of the main relay.

The fault diagnosis function may be configured to make, if the electric load is normally driven when the attempt is made, the attempt for the second time, and to determine that the main relay is in the fault state if the electric load is normally driven when the attempt is made for the second time.

The fault diagnosis function may be configured to make, if the electric load is normally driven when the attempt is made, a diagnosis of presence of a breakage fault in a power supply path of the electric load on the basis of followability of the electric load to the drive command.

The fault diagnosis function may be configured to make, if the electric load is normally driven when the attempt is made, a diagnosis of presence of a breakage fault in a power supply path of the electric load on the basis of a value of a current flowing into the electric load through the power supply path.

The fault diagnosis function may be configured to monitor a time elapsed since the control section transmits the stop command by use of the control section, the attempt being made when the monitored elapsed time exceeds a threshold time set at a value determined depending on a response time needed for the main relay to change from the on state to the off state in response to the stop command.

The threshold time may be a sum of the response time and a predetermined margin time.

The fault diagnosis function may be configured to, when a diagnosis that the main relay is in the fault state is made, notify a result of the diagnosis, and store the result of the diagnosis in a nonvolatile memory included in the electronic control unit.

The fault diagnosis function is configured to, when a diagnosis that the main relay is in the fault state is made, transmit a result of the diagnosis as a fail-safe command to other electronic control units through an in-vehicle network.

The control section and the timer section may be separately formed in different IC chips.

The control section and the timer section may be integrated in the same IC chip.

According to the present invention, it becomes possible to early diagnose presence of a fault in the main relay or in its control line.

PREFERRED EMBODIMENTS OF THE INVENTION

First Embodiment

Figure 1:
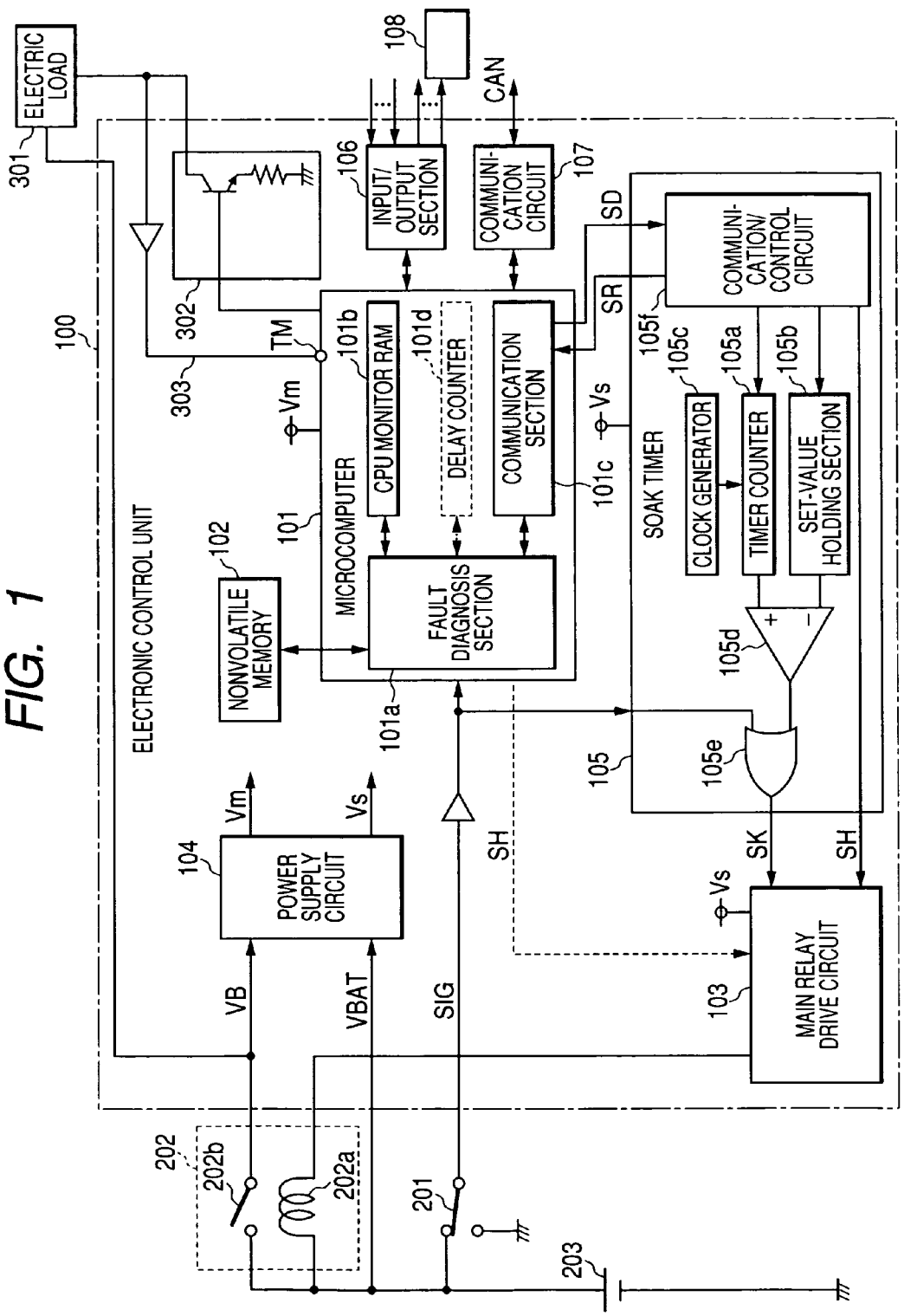
FIG. 1 is a block diagram showing structures of an electronic control unit according to a first embodiment of the invention and its peripheral circuits.

FIG. 1 is a diagram showing structures of an electronic control unit 100 according to a first embodiment of the invention, and its peripheral circuits.

As shown in this figure, an indicating lamp 108, an ignition switch 201, a main relay 202, a vehicle battery 203, an electric load 301 such as an cooling fan, etc, are connected to the electronic control unit 100 as its peripheral circuits.

The electronic control unit 100 is mainly constituted by a microcomputer 101, a nonvolatile memory 102 connected to the microcomputer 101, a main relay drive circuit 103, a power supply circuit 104, a soak timer 105, an input/output section 106, a communication circuit 107, and an electric load drive circuit 302 for driving the electric load. The electronic control unit 100 is connected to an in-vehicle network such as CAN (Controller Area Network) through the communication circuit 107 so as to be capable of communicating with other electronic control units mounted on the same vehicle. The electric load drive circuit 302 is constituted by a power transistor and load resistors.

The microcomputer 101 has an external load terminal TM connected to a node between the electric load 301 and the electric load drive circuit 302 through a pick-up path 303.

The microcomputer 101 of the electronic control unit 100 includes a CPU monitor RAM 101b which is a volatile memory, and a communication section 101c.

The microcomputer 101 operates as a host computer of the electronic control unit 100 to perform an engine control process under normal conditions, and other various processes including a diagnosis process for the evapo-purge system. The microcomputer 101 also includes a fault diagnosis section 101a for performing a fault diagnosis on the main relay 202 and its control line including the main relay drive circuit 103 and the soak timer 105.

The microcomputer 101 is configured to transmit a cut-off request signal (power supply interruption command) SD to the soak timer 105 through the communication section 101c to turn off the main relay 202, when the ignition switch 201 is turned off, and when the fault diagnosis on the evapo-purge system is completed. The microcomputer 101 is also configured to make an attempt to drive the electric load 301 by outputting a drive command to the electric load drive circuit 302 utilizing a time period after the microcomputer outputs the cut-off request signal SD, and to monitor followability of the electric load to the drive command. The fault diagnosis section 101a is configured to diagnose whether or not the main relay 202 is in a state where it cannot be controlled to the off state, and also diagnose whether or not there is a breakage fault in a power supply path (cable) through which electric power is supplied to the electric load 301. When it is diagnosed that the main relay 202 is in the state where it cannot be controlled to the off state, the microcomputer 101 stores the result of this diagnosis in the nonvolatile memory 102, lights the indicating lamp 108, and transmits a fail-safe command to other electronic control units through the communication circuit 107 to notify occurrence of the fault in the main relay 202.

The main relay drive circuit 103, which performs on/off control on the main relay 202, turns on the main relay 202 upon receiving a drive command SK which the soak timer 105 outputs when an ON signal SIG is sent from the ignition switch 201, and when a timer counter 105a (to be described later) thereof is timed up. The main relay drive circuit 103 turns off the main relay 202 upon receiving a stop command SH from the soaktimer 105. The main relay 202 is constituted by a relay coil 202a and a relay contact 202b. When a drive current is passed through the relay coil 202a by the main relay drive circuit 103, the relay contact 202b is closed, as a result of which a battery voltage VBAT is applied to the power supply circuit 104 of the electronic control unit 100 as a drive voltage VB. When the drive current to the relay coil 202a is interrupted, the relay contact 202b is opened, as a result of which the application of the drive voltage VB to the power supply circuit 104 is removed.

The power supply circuit 104 generates an operation voltage Vm supplied to the microcomputer 101 from the drive voltage BV, and also generates an operation voltage Vs supplied to the main relay drive circuit 103, soak timer 105, etc. directly from the battery voltage VBAT.

The soak timer 105 is mainly constituted by the timer counter 105a, a set-value holding section 105b, a clock generator 105c, and a communication/control circuit 105f. The soak timer 105 is configured to operate on the drive voltage Vs supplied from the power supply circuit 104 irrespective of the on/off state of the ignition switch 201.

The timer counter 105a is configured to count oscillation signals (clocks) generated by the clock generator 105c to measure time. The set-value holding section 105b is for holding a start-up set time TH of the soak timer 105b. The set-value holding section 105b can be constituted by a register or the like.

The communication/control circuit 105f of the soak timer 105 operates as a communication interface for transmitting and receiving the start-up set time TH, a timer counter clear signal, the cut-off request signal SD, a reception acknowledge SR, etc. with the microcomputer 101. The communication/control circuit 105f includes a function of controlling renewal of the start-up set time TH held in the set-value holding section 105b, a function of controlling the counting operation of the timer counter 105a, and a function of controlling the main relay drive circuit 103 by outputting the stop command SH in response to the cut-off request signal SD. More specifically, the communication/control circuit 105f is configured to rewrite the start-up set time TH held in the set-value holding section 105b in accordance with instruction concerning the start-up set time TH sent from the microcomputer 101, and to clear the timer counter 105a upon receiving the timer counter clear signal. The communication/control circuit 105f is also configured to return the reception acknowledge SR upon receiving the cut-off request signal from the microcomputer 101, while outputting the stop command SH to the main relay drive circuit 103.

The soak timer 105 compares the count value of the timer counter 105a with the start-up set time TH held in the set-value holding section 105b by use of a comparator 105d, and outputs the drive command SK to the main relay drive circuit 103 through an OR circuit 105e when they coincide to each other. The soak timer 105 outputs the drive command SK to the main relay drive circuit 103 through the OR circuit 105e also when the ON signal SIG is sent from the ignition switch 201.

The input/output section 106 of the electronic control unit 100 includes various interface circuits, an A/D converter circuit for converging sensor signals into digital signals, various driver circuits, etc. Actuators and sensors for a various devices including fuel pump, an electric pump module, a purge control valve, and a fuel injector, etc. are connected to the input/output section 106, so that they can be controlled and monitored by the electric control unit 100. The indicating lamp 108 connected to the input/output section 106 is lit when the fault diagnosis section 101a of the microcomputer 101 makes a diagnosis that the main relay 202 is in the state where it cannot be controlled to the off state. The indicating lamp 108 is installed in a place easily visible from vehicle passengers, for example, in a meter panel.

Next, the control process performed by the microcomputer 101 is explained with reference to the flowchart shown in FIG. 2. This control operation is performed at regular intervals, for example, every 100 ms. The control process begins by checking at step S10 whether or not the start-up of the microcomputer 101 itself has been caused by the action of the soak timer 105. This check is made taking account of whether or not the ignition switch 201 is in the off state where the On signal SIG is not received by the microcomputer 101.

Figure 2:
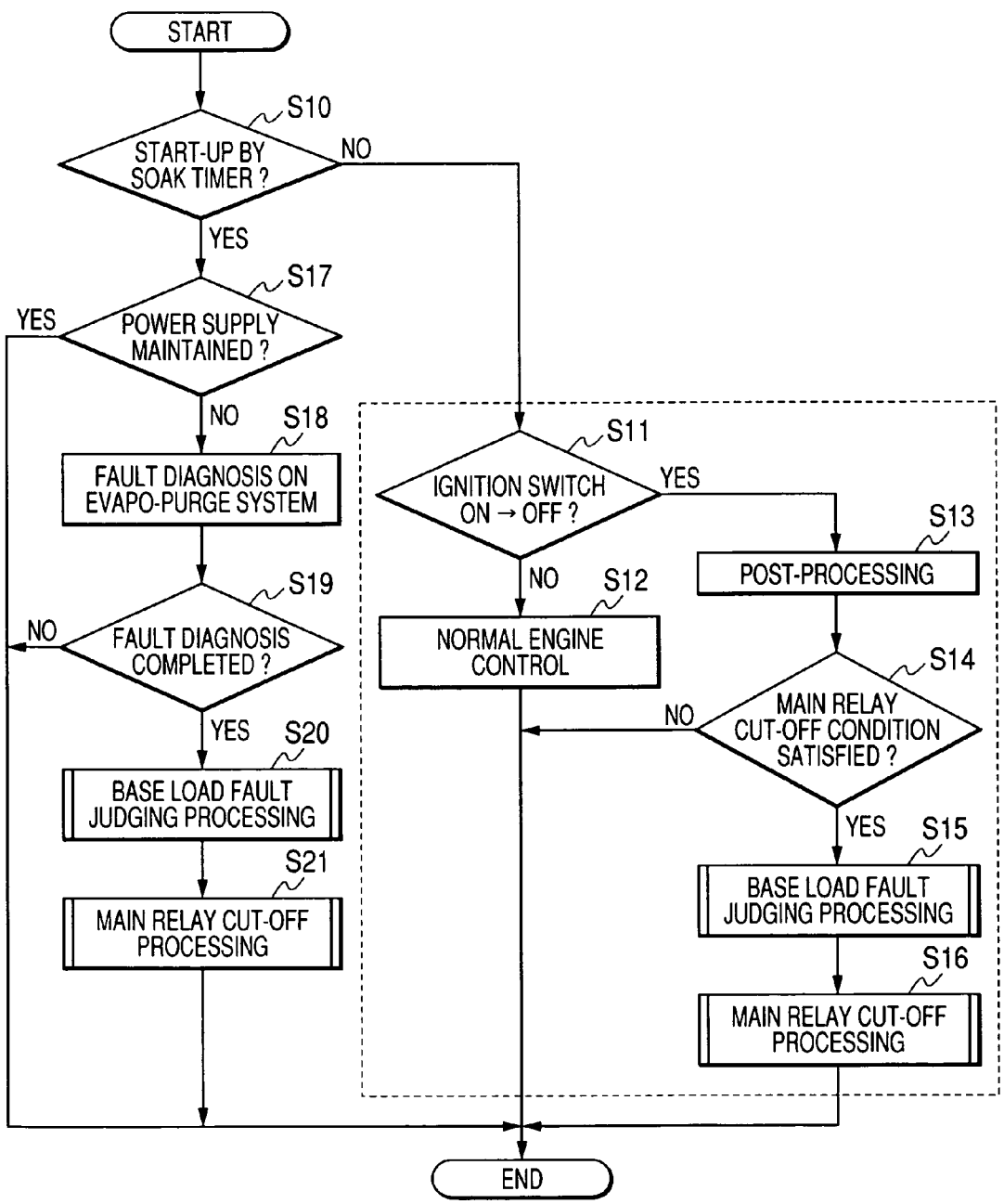
FIG. 2 is a flowchart showing processing steps of a control process performed by a microcomputer included in the electronic control unit according to the first embodiment of the invention.

If it is determined that the start-up of the microcomputer 101 has not been caused by the action of the soak timer 105, but caused by the manipulation of the ignition switch 201, a base process boxed by the broken line in FIG. 2 is performed. This base process begins by checking at step S11 whether the ignition switch 201 is switched from the on position to the off position. If it is determined at step S11 that the ignition switch 201 is in the on position (NO in step S11), a normal engine control is performed at step S12.

Figure 3:
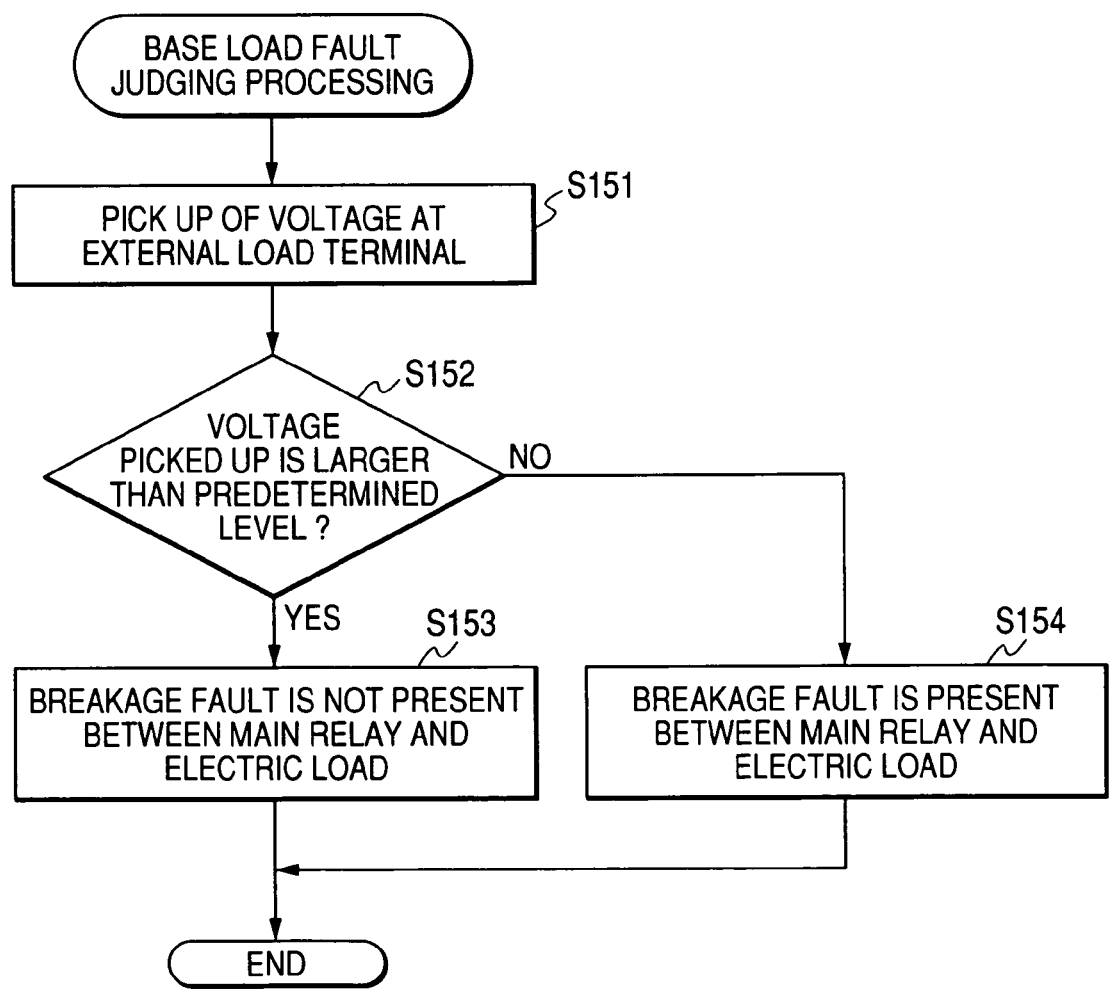
FIG. 3 is a flowchart showing steps of a base load fault judging processing included in the control process performed by the microcomputer included in the electronic control unit according to the first embodiment of the invention.

On the other hand, if it is determined at step S11 that the ignition switch 201 has been just switched to the off position (YES in step S11), a post-processing including learning of a fully closed position in an electronic throttle control, and writing of various learned values and necessary data into the nonvolatile memory 102, which the microcomputer 101 should perform before entering the stopped state, is performed at step S13. After completion of the post-processing, it is checked at step S14 whether or not the condition for turning off the main relay 202 (main relay cut-off condition) is satisfied. If it is determined at step S14 that the main relay cut-off condition is not satisfied, the control process is ended for a time. The post-processing is performed repeatedly until the main relay cut-off condition is satisfied. If it is determined at step S14 that the main relay cut-off condition is satisfied, a base load fault judging processing is performed at step S15. Here, explanation is made to the base load fault judging processing with reference to the flowchart shown in FIG. 3.

The base load fault judging processing begins by picking up, at step S151, a voltage at a ground terminal of the electric load 301, that is, a voltage applied to the external load terminal TM of the microcomputer 101. Subsequently, it is checked at step S152 whether or not the picked up voltage is equal to or larger than a predetermined level. Normally, the electric load 301 is applied with the drive voltage VB when the main relay 202 is in the on state. However, if there occurs a breakage fault on a power supply path between the main relay 202 and the electric load 301, the application of the drive voltage VB to the electric load 301 is interrupted. Accordingly, the level of the picked up voltage depends on whether or not there is a breakage fault on the power supply path. More specifically, it is checked at step S152 whether or not the voltage picked up at the external load terminal is equal to the drive voltage VB subtracted by a voltage drop of the electric load 301. If it is determined at step S152 that the picked up voltage is larger than the predetermined level, it is determined at step S153 that there is not breakage fault on the power supply path between the main relay 202 and the electric load 301 to end the base load fault judging processing. On the other hand, if it is determined at step S152 that the picked up voltage is smaller than the predetermined level, it is judged at step S154 that there is a breakage fault or a short circuit to the ground on the power supply path between the main relay 202 and the electric load 301. And the result of this judgment is stored in the nonvolatile memory 102 to end the base load fault judging processing.

Returning to FIG. 2, when the base load fault judging processing is completed, the control process moves to step S16 to perform a main relay cut-off processing. Here, the explanation is made to the main relay cut-off processing with reference to the flowchart shown in FIG. 4.

As shown in this figure, the main relay cut-off processing begins by checking at step S161 whether or not the cut-off request signal SD has been transmitted to the soak timer 105. If it is determined at step S161 that the cut-off request signal SD has not been transmitted, the cut-off request signal SD is transmitted through the communication section 101c at step S162. At this time, the timer counter clear signal commanding to clear the count value of the timer counter 105a of the soak timer 105 is also transmitted.

After that, it is checked at step S163 whether or not the reception acknowledgement SR has been transmitted from the soak timer within a predetermined time. If it is determined at step S163 that the reception acknowledge SR has been returned from the soak timer 105 within a predetermined time, the processing is ended for a time. In such a normal case, the stop command SH is outputted from the soak timer 105, and as a result the application of the operation voltage Vm to the microcomputer 101 is interrupted, because the relay drive circuit 103 control the main relay 102 to the off state. In this way, the microcomputer 101 enters the stopped sate after a lapse of a predetermined time from the time when the cut-off request signal SD is transmitted at step S162.

On the other hand, if it is determined at step S163 that the reception acknowledge SR has not been returned from the soak timer 105 within the predetermined time, the result of this check indicating that there is fault or abnormality in the soak timer 105 is stored in the nonvolatile memory 102 at step S164, and then notified to the vehicle passengers through illumination of the indicating lamp 108 at step S165. In this case, since the possibility that the main relay 202 cannot be controlled to the off state is high, the result of this check is transmitted to other electronic control units connected to the in-vehicle network, so that they can operate in a fail-safe mode taking account of the fact that there is abnormality in the soak timer 105.

In the case where the main relay 202 cannot be controlled to the off state when the cut-off request signal SD is transmitted to the soak timer 105 due to abnormality in the control line of the main relay 202, the main relay cut-off processing continues even after transmission of the cut-off request signal SD, because the supply of electric power to the microcomputer 101 continues. In this case, since the transmission of the cut-off request signal SD has been already done, the check result at step S161 becomes affirmative (YES), it is checked at step S166 whether or not the nonvolatile memory 102 stores a fault record (abnormality record). If it is determined that at step S166 that the nonvolatile memory 102 stores a fault record (abnormality record), the processing is ended for a time.

On the other hand, if it is determined that at step S166 that the nonvolatile memory 102 stores no fault record (no abnormality record), an attempt is made to drive the electric load 301 by outputting the drive command to the electric load drive circuit 302 at step S167. At this time, the value of a voltage picked up at the external load terminal TM is stored in the CPU monitor RAM 101b at step S168. Incidentally, when the main relay 202 is changed to the off state in response to the cut-off request signal, the attempt to drive the electric load 301 is not made, because the supply of electric power to the microcomputer 101 is interrupted. Accordingly, since if the attempt to drive the electric load 301 is made, it means that the supply of electric power to the microcomputer 101 is continuing, it is diagnosed that there is a fault in the main relay 202 or in its control line. In this embodiment, it is also diagnosed whether or not a breakage fault is in a power supply path leading from the node between the electric load 301 and the electric load drive circuit 302 to the ground as explained below.

After the pick-up of the voltage at the external load terminal TM is performed for a predetermined time, it is checked at step S169 whether or not the voltage picked up is following the drive command by comparing the phase of the picked up voltage with the phase of the drive command. If it is determined at step 169 that the voltage picked up is following the drive command, it is judged that there is not a break in the power supply path leading from the node (pick up point) between the electric load 301 and the electric load drive circuit 302 to the ground, nor a fault in the power transistor of the electric load drive circuit 302. And the result of this judgment is stored in the nonvolatile memory 102 at step S170. The result of this judgment is also notified to the vehicle passengers through illumination of the indicating lamp 108, and transmitted as a fail-safe command to other electronic control units connected to the in-vehicle network at step S171, to complete this processing. On the other hand, if it is determined at step S169 that the voltage picked up is not following the drive command, it is judged at step S172 that there is a break in the electrical path, or a fault in the power transistor of the electric load drive circuit 302. The result of this judgment is notified to the vehicle passengers through illumination of the indicating lamp 108, and is transmitted as a fail-safe command to other electronic units at step S171 to complete the main relay cut-off processing. In this way, it becomes possible to perform the fault diagnosis on the main relay 202 and its control line, while performing the diagnosis to determine whether or not there is a break or the like in the power supply path.

On the other hand, if it is determined at step S10 in FIG. 2 that the start-up of the microcomputer 101 has been caused by the action of the soak timer 105, it is checked at step S17 whether the microcomputer 101 has been started up in a state where the supply of electric power to the microcomputer 101 has been maintained. In other words, it is checked at step S17 whether or not the main relay 202 was turned off normally by the manipulation of the ignition switch 201, and then the microcomputer 101 was started up by the action of soak timer 105. If it is determined at step S17 that the microcomputer 101 has been started up in a state where the supply of electric power has been maintained, that is, if it is determined that the main relay 202 is already in a state where it cannot be controlled to the off state, the control process is ended without performing the fault diagnosis process on the evapo-purge system. Incidentally, the diagnosis that there is fault in the main relay 202 has been already made by the above explained main relay cut-off processing. On the other hand, if it is determined at step S17 that the microcomputer 101 has been started up in a state where the supply of electric power has not been maintained, the fault diagnosis processing on the evapo-purge system is performed at step S18. If any fault is detected at step S18, the result of this diagnosis is stored in the non-volatile memory 102, and electric loads such as a throttle valve are returned to their starting states.

After that, it is checked at step S19 whether or not the fault diagnosis processing on the evapo-purge system has been completed. If it is determined that the fault diagnosis processing on the evapo-purge system has been completed, a base load fault judging processing, which is the same as the base load fault judging processing at step S15, is performed at step S20 to complete the control process. Subsequently, a main relay cut-off processing, which is the same as the main relay cut-off processing at step S16, is performed at step S21 to complete the control process. As explained above, since the main relay cut-off processing is performed even after the fault diagnosis on the evapo-purge system is completed, the fault diagnosis on the main relay 202 can be performed after the microcomputer 101 is started up by the action of the soak timer 105.

Figure 5:
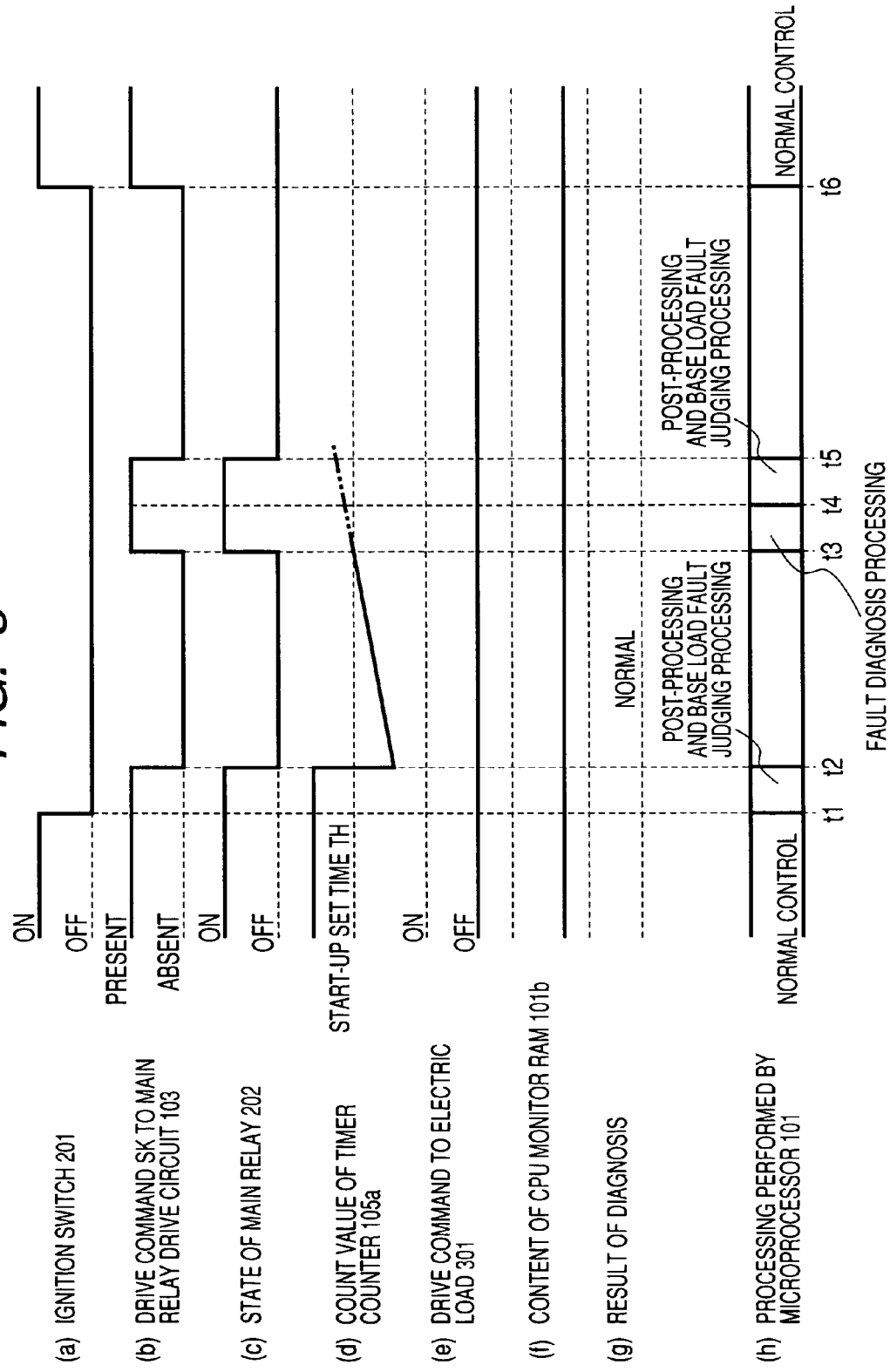
FIG. 5 is a timechart showing temporal changes of each signal and each part in the electronic control unit according to the first embodiment of the invention when an ignition switch is turned off.

Next, explanation is made on the temporal changes of each signal and each part of the electronic control unit of this embodiment when the ignition switch 201 is turned on with reference to the timechart shown in FIG. 5 for a case where there is no breakage in the power supply path, and there is no fault in the main relay 202 or in its control system, and the main relay 202 is in the state where it can be controlled to the off state.

As shown in the timechart of FIG. 5, when the ignition switch 201 is switched from the off position to the on position at timing t1, the microcomputer 101 performs the above described post-processing including transmission of the cut-off request signal SD to the soak timer 105 (see (h) in FIG. 5). When the post-processing is completed at timing t2, the output of the drive command SK is stopped in response to the transmission of the cut-off request signal SD, as a result of which the main relay 202 is changed to the off state (see (b), (c) in FIG. 5). Also, at this timing t2, the timer counter 105a is cleared in accordance with the timer counter clear signal sent from the microcomputer 101, and the soak timer 105 starts clocking (see (d) in FIG. 5). Incidentally, the output of the drive command to the electric load drive circuit 302, and the storing of the voltage picked up at the external load terminal TM into the CPU monitor RAM 101b are not performed (see (e), (f) in FIG. 5), because the microcomputer 101 enters the stopped state with the change of the main relay 202 into the off state. Accordingly, a diagnosis that the main relay 202 is in the state where it can be normally controlled to the off state is made (see (g) in FIG. 5).

When the count value of the timer counter 105a exceeds the start-up set time TH at timing t3 (see (d) in FIG. 5), the main relay 202 is controlled to the on state by the action of the soak timer 105, as a result of which the microcomputer 101 is applied with the operation voltage Vm. After the microcomputer 101 is started up in this way, the fault diagnosis processing on the evapo-purge system is performed (see (h) in FIG. 5). When this fault diagnosis processing is completed at timing t4, the above described post-processing including communication with the soak timer 105 is performed at timing t4. As a result, the main relay 202 is changed to the off state in response to stop of output of the drive command SK to the main relay drive circuit 103 (see (b), (c) in FIG. 5), and the microcomputer 101 enters the stopped state again. Accordingly, also in this case, it is diagnosed that the main relay 202 is normally controlled to the off state (see (g) in FIG. 5). It should be noted that when the ignition switch 201 is switched to the on state at timing t6, the microcomputer 101 starts performing a normal engine control after performing a specific initialization process (not shown).

Figure 6:
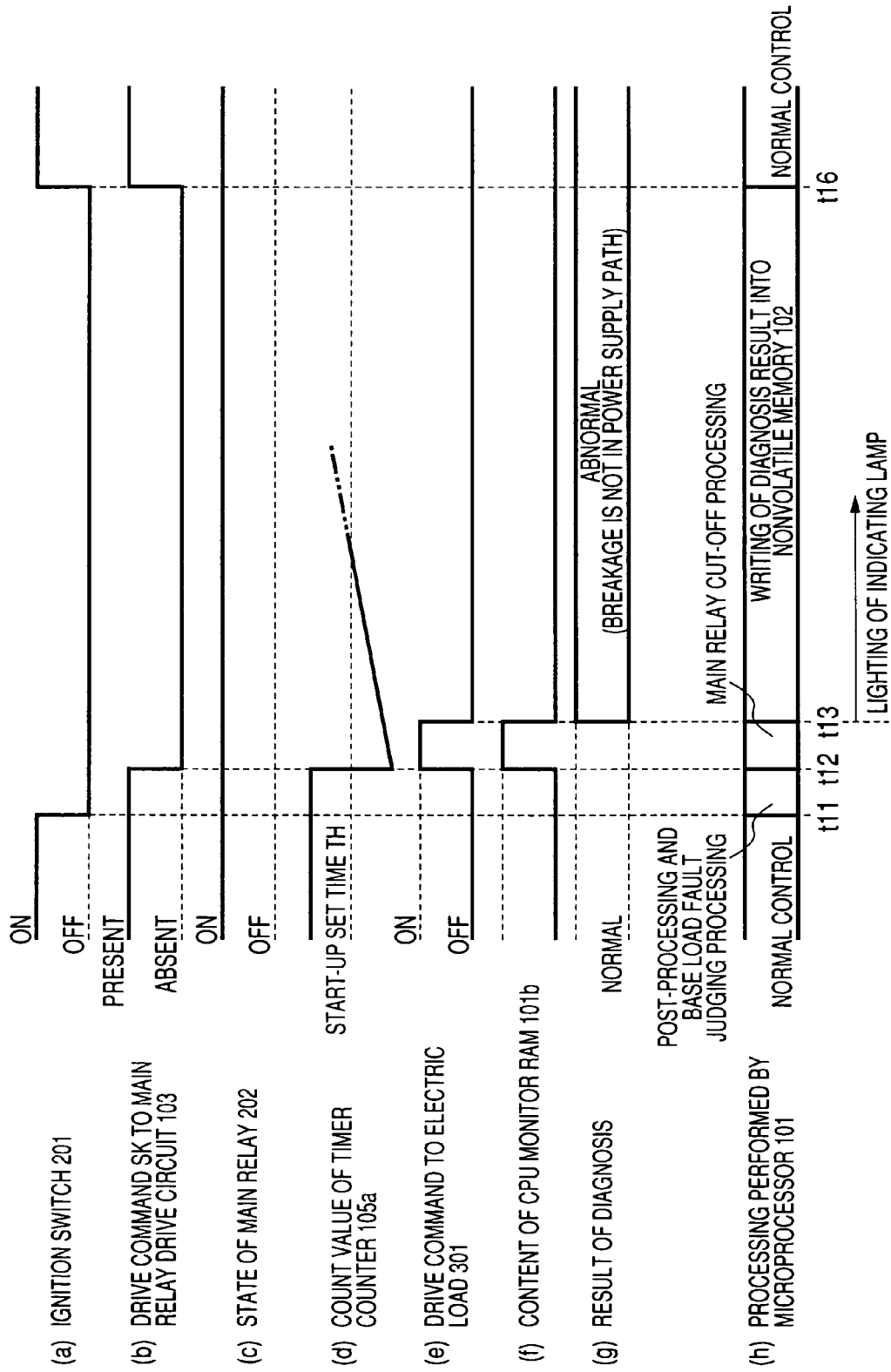
FIG. 6 is a timechart showing temporal changes of each signal and each part in the electronic control unit according to the first embodiment of the invention when then ignition switch is turned off.

Next, explanation is made on the temporal changes of each signal and each part of the electronic control unit of this embodiment when the ignition switch 201 is turned on with reference to the timechart shown in FIG. 6 for a case where there is no breakage in the power supply path, but there is a fault in the main relay 202 or in its control system when the ignition switch 201 is switched to the off position.

As shown in the timechart of FIG. 6, when the ignition switch 201 is switched from the on position to the off position at timing t11, the microcomputer 101 performs the above described post-processing including transmission of the cut-off request signal SD to the soak timer 105 (see (h) in FIG. 6). When the post-processing is completed at timing t12, the output of the drive command SK is stopped in response to the transmission of the cut-off request signal SD (see (b) in FIG. 5). Also, at this timing t12, the timer counter 105a is cleared in accordance with the timer counter clear signal sent from the microcomputer 101, and the soak timer 105 starts clocking (see (d) in FIG. 5). However, if there is a fault in the main relay 202 at this moment, an attempt to drive the electric load 301 by outputting the drive command to the electric load 302 circuit 302 is made (see (e) in FIG. 6), because the main relay 202 is kept at the on state irrespective of the stop of output of the drive command SK by the action of the soak timer 105 (see (c) in FIG. 5). And the voltage picked up at the external load terminal TM is stored in the CPU monitor RAM 101b (see (f) in FIG. 6). The voltage picked up at the external load terminal TM follows the drive command as long as there exists no breakage fault in the power supply path of the electric load 301. Accordingly, it is diagnosed that the main relay 202 is in the state where it cannot be controlled to the off state, although there exists no breakage fault in the power supply path at timing t13 (see (g) in FIG. 6). The result of this diagnosis is written into the nonvolatile memory 102, and is notified to the vehicle passengers through illumination of the indicating lamp 108 (see (h) in FIG. 6). Although not shown in FIG. 6, the result of this diagnosis is also transmitted as a fail-safe command to other electronic control units connected to the in-vehicle network. It should be noted that when the ignition switch 201 is switched to the on position at timing t16, the microcomputer 101 starts performing the normal engine control after performing a specific initialization process (not shown) if the vehicle battery is in a condition to supply electric power.

Incidentally, it is preferable to transmit the cut-off request signal SD and to make again an attempt to drive the electric load 301 utilizing a time period after transmission of this cut-off request signal SD, when the electric load 301 is normally driven by making the attempt to drive the electric load 301 in view of improving reliability of the fault diagnosis on the main relay 202. That is because, it is known empirically that the main relay 202 is often recovered by retransmitting the cut-off request signal SD when the main relay 202 cannot be controlled to the off state only temporarily by contact sticking, for example. Accordingly, if the electric load 301 is normally driven by the retransmission (retry) of the cut-off request signal SD from the microcomputer 101, it means that there is high possibility that there occurs an unrecoverable fault in the main relay 202 or in its control line.

Figure 7:
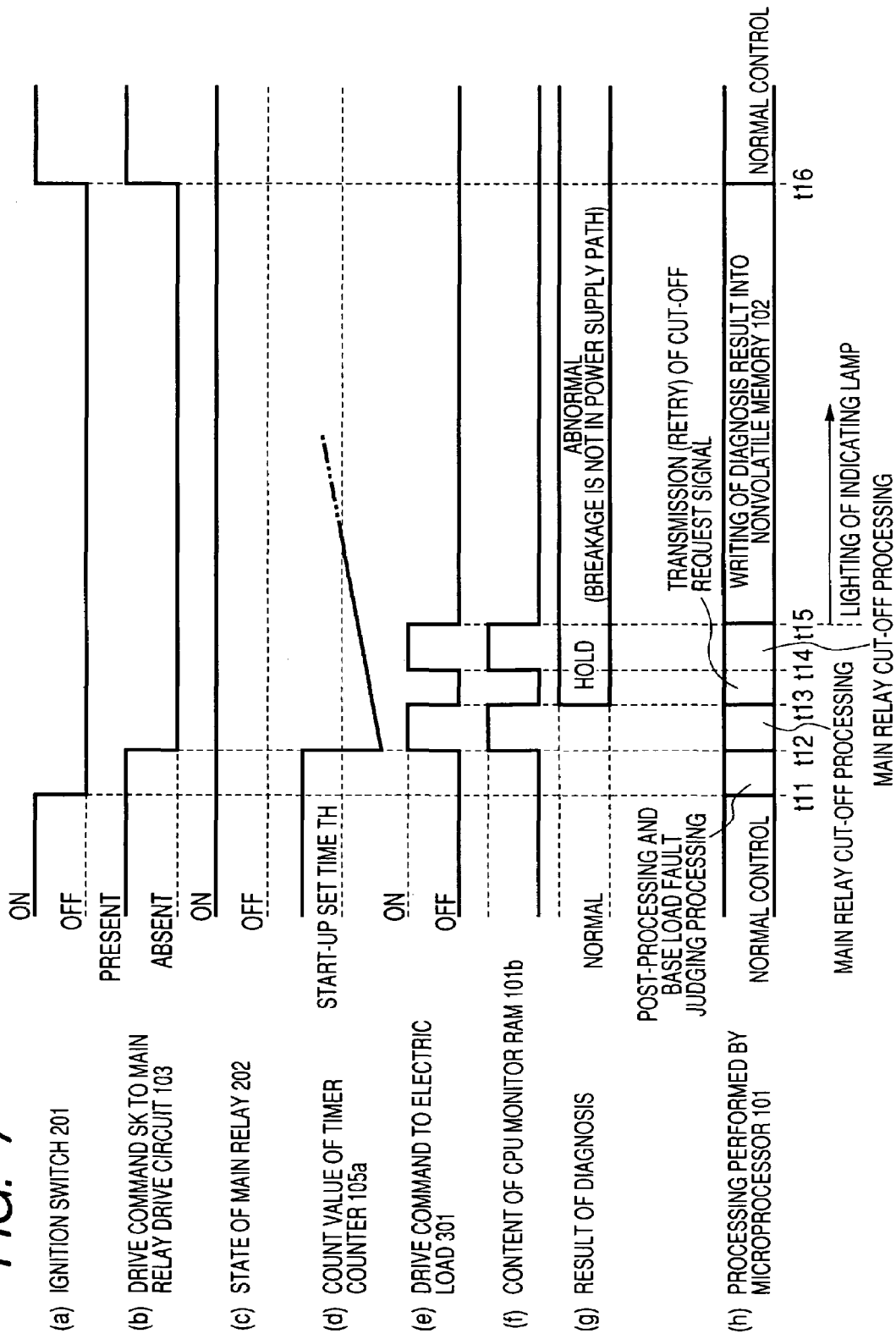
FIG. 7 is a timechart showing temporal changes of each signal and each part in the electronic control unit according to the first embodiment of the invention when then ignition switch is turned off.

Next, explanation is made on the temporal changes of each signal and each part of the electronic control unit of this embodiment when such a retry (retransmission) of the cut-off request signal SD is performed with reference to the timechart shown in FIG. 7.

Also in this case, if there is a fault in the main relay 202 or in its control line, the voltage picked up at the external load terminal TM follows the drive command for a time period between timing t12 and timing t13 (see (e), (f) in FIG. 7). However, the diagnosis that there is a fault in the main relay 202 is not made promptly, but is put on hold (see (g) in FIG. 7), because the cut-off request signal SD is retransmitted and the attempt to drive the electric load 301 by outputting the drive command to the electric load drive circuit 302 is made again during a time period between timing t13 and timing t14. If the main relay 202 is changed to the off state by this retransmission of the cut-off request signal SD, the supply of electric power to the microcomputer 101 is interrupted, and accordingly the diagnosis that there is a fault in the main relay 202 is not made.

On the other hand, if the main relay 202 is not changed to the off state by this retransmission of the cut-off request signal SD, the attempt to drive the electric load 301 is made again. If it is determined at timing t15 that the voltage picked up at the external load terminal TM follows the drive command, it is diagnosed that the main relay is in the state where it cannot be controlled to the off state. By retransmitting the cut-off request signal SD, the reliability of the fault diagnosis on the main relay 202 can be enhanced. Although the number of times of transmission of the cut-off request signal SD followed by the attempt to drive the electric load 301 is set at two in this embodiment, it may be set at different number.

Figure 8:
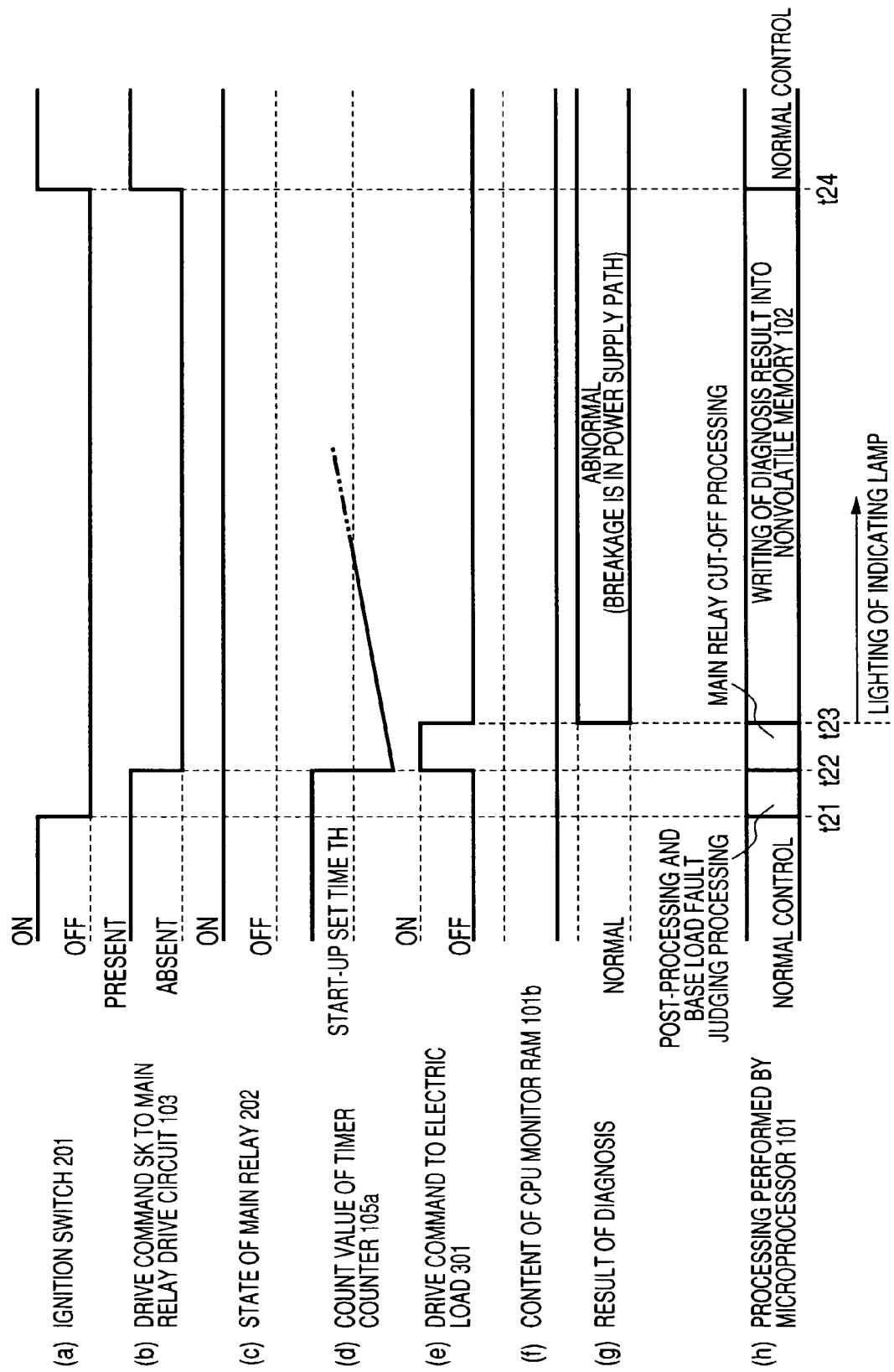
FIG. 8 is a timechart showing temporal changes of each signal and each part in the electronic control unit according to the first embodiment of the invention when then ignition switch is turned off.

Next, explanation is made on the temporal changes of each signal and each part of the electronic control unit of this embodiment when the ignition switch 201 is turned on with reference to the timechart shown in FIG. 8 for a case where there is a breakage in the power supply path, and there occurs a fault in the main relay 202 or in its control system after the ignition switch is switched to the off position.

As shown in the timechart of FIG. 8, when the ignition switch 201 is switched from the on position to the off position at timing t21, the microcomputer 101 performs the above described post-processing including transmission of the cut-off request signal SD to the soak timer 105 (see (h) in FIG. 8). When the post-processing is completed at timing t22, the output of the drive command SK is stopped in response to the transmission of the cut-off request signal SD (see (b) in FIG. 8). Also, at this timing t22, the timer counter 105a is cleared in accordance with the timer counter clear signal sent from the microcomputer 101, and the soak timer 105 starts clocking (se (d) in FIG. 8). However, if there is a fault in the main relay 202 at this moment, the attempt to drive the electric load 301 by outputting the drive command to the electric load drive circuit 302 is made (see (e) in FIG. 8), because the main relay 202 is kept at the on state irrespective of the stop of output of the drive command SK by the action of the soak timer 105 (see (c) in FIG. 8). At this time, the value of the voltage picked up at the external load terminal TM is stored in the CPU monitor RAM101b. When there is a fault in the power supply path of the electric load 301, the picked up voltage stored in the CPU monitor RAM 101b is kept unchanged (see (f) in FIG. 8). That is, when there is a fault in the power supply path of the electric load 301, the picked up voltage does not follow the drive command. Accordingly, it is diagnosed that the main relay 202 is in the state where it cannot be controlled to the off state, and there is also a breakage fault in the power supply path at timing t23 (see (g) in FIG. 8). The result of this diagnosis is written into the nonvolatile memory 102, and is notified to the vehicle passengers through illumination of the indicating lamp 108 (see (h) in FIG. 8). Although not shown in FIG. 8, the result of this diagnosis is also transmitted as a fail-safe command to other electronic control units connected to the in-vehicle network. It should be noted that when the ignition switch 201 is switched to the on position at timing t24, the microcomputer 101 starts performing the normal engine control after performing a specific initialization process (not shown) if the vehicle battery is in a condition to supply electric power. Although not shown in FIG. 8, a retry processing such as shown in FIG. 7 may be performed.

Figure 9:
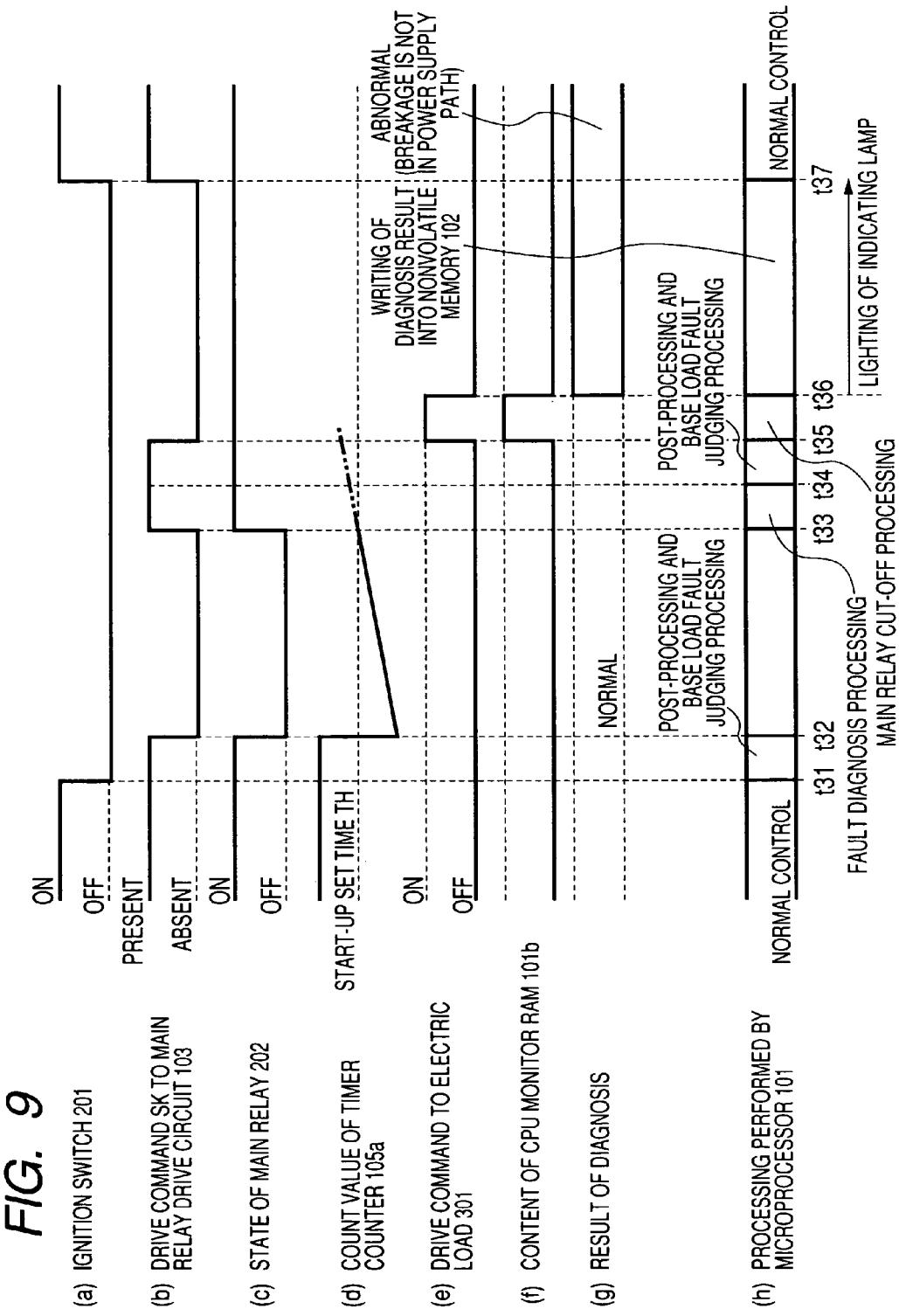
FIG. 9 is a timechart showing temporal changes of each signal and each part in the electronic control unit according to the first embodiment of the invention when an ignition switch is turned off.

Next, explanation is made on the temporal changes of each signal and each part of the electronic control unit of this embodiment when the ignition switch 201 is turned on with reference to the timechart shown in FIG. 9 for a case where there is not breakage fault on the power supply path of the electric load 301 but there occurs a fault in the main relay 202 or in its control line after the microcomputer 101 is started up by the action of the soak timer 105.

As shown in the timechart of FIG. 9, when the ignition switch 201 is switched from the on position to the off position at timing t31, the microcomputer 101 performs the above described post-processing (see (h) in FIG. 9). When the post-processing is completed at timing t32, the output of the drive command SK is stopped in response to the transmission of the cut-off request signal SD (see (b) in FIG. 9). Also, at this timing t32, the timer counter 105a is cleared in accordance with the timer counter clear signal sent from the microcomputer 101, and the soak timer 105 starts clocking (see (d) in FIG. 9).

After that, when the count value of the timer counter 105a exceeds the start-up set time TH at timing t33 (see (d) in FIG. 9), the main relay 202 is controlled to the on state by the action of the soak timer 105, as a result of which the microcomputer 101 is applied with the operation voltage Vm (see (c) in FIG.

9). After the microcomputer 101 is started up, the fault diagnosis processing on the evapo-purge system is performed (see (h) in FIG. 9). When the fault diagnosis processing on the evapo-purge system is completed at timing t34, the above described post-processing is performed. As a result, the output of the drive command SK is stopped at timing t35 (see (b) in FIG. 9). However, if there is a fault in the main relay 202 at this moment, an attempt to drive the electric load 301 by outputting the drive command to the electric load circuit 302 is made (see (c) in FIG. 9), because the main relay 202 is kept at the on state irrespective of the stop of output of the drive command SK by the action of the soak timer 105 (see (e) in FIG. 9). And the voltage picked up at the external load terminal TM is stored in the CPU monitor RAM 101b (see (f) in FIG. 9). The picked up voltage follows the drive command as long as there exists no breakage fault in the power supply path of the electric load 301. Accordingly, it is diagnosed that the main relay 202 is in the state where it cannot be controlled to the off state, although there exists no breakage fault in the power supply path at timing t36 (see (g) in FIG. 9). The result of this diagnosis is written into the nonvolatile memory 102, and is notified to the vehicle passengers through illumination of the indicating lamp 108 (see (h) in FIG. 9). Although not shown in FIG. 9, the result of this diagnosis is also transmitted as a fail-safe command to other electronic control units connected to the in-vehicle network. It should be noted that when the ignition switch 201 is switched to the on position at timing t37, the microcomputer 101 starts performing the normal engine control after performing a specific initialization process (not shown) if the vehicle battery is in a condition to supply electric power. Although not shown in FIG. 9, a retry processing such as shown in FIG. 7 may be performed.

Figure 10:
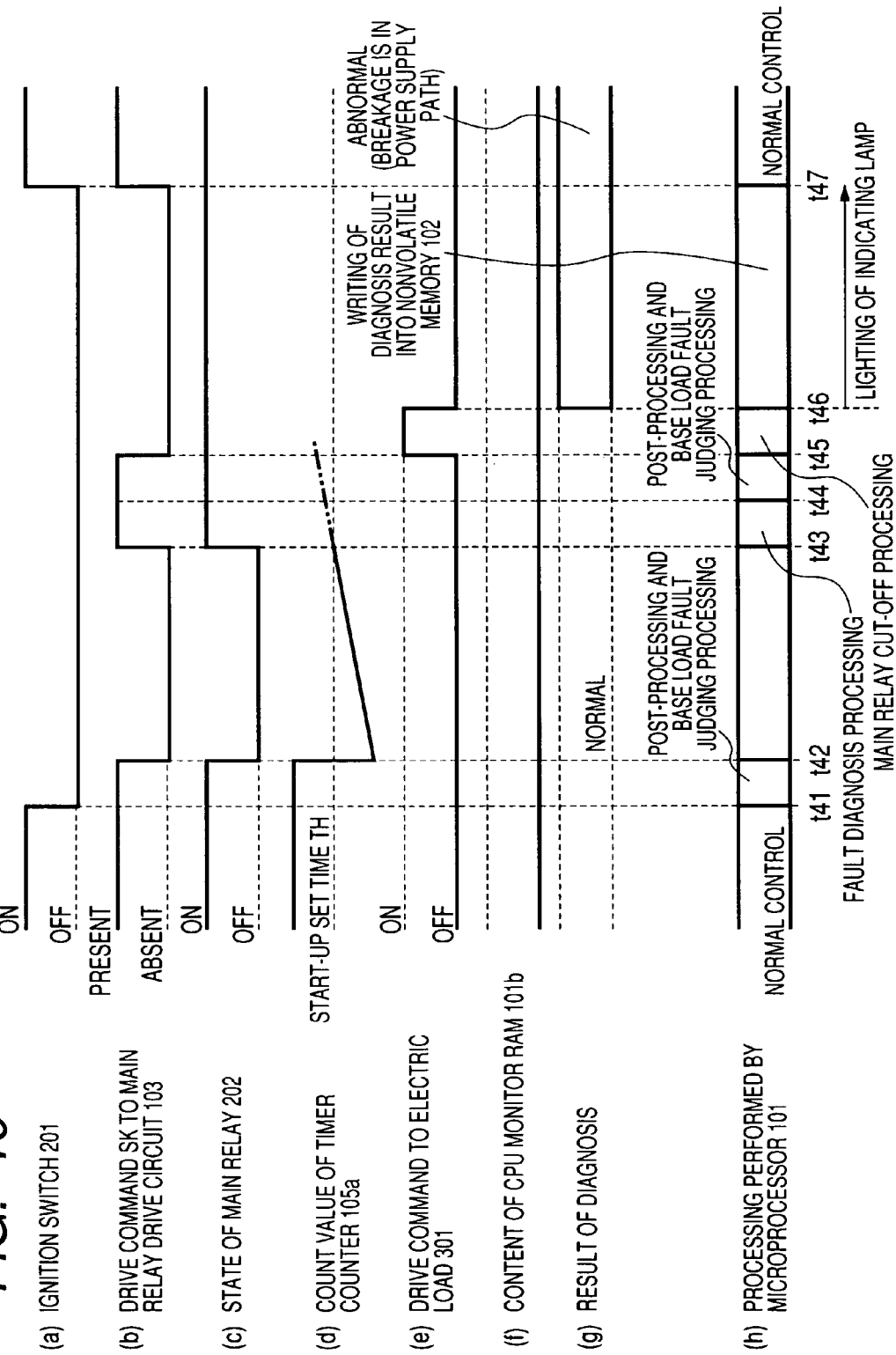
FIG. 10 is a timechart showing temporal changes of each signal and each part in the electronic control unit according to the first embodiment of the invention when the ignition switch is turned off.

Next, explanation is made on the temporal changes of each signal and each part of the electronic control unit of this embodiment when the ignition switch 201 is turned on with reference to the timechart shown in FIG. 10 for a case where there is a breakage in the power supply path, and there occurs a fault in the main relay 202 or in its control system after the microcomputer i101 is started up by the action of the soak timer 105.

As shown in the timechart of FIG. 10, when the ignition switch 201 is switched from the on position to the off position at timing t41, the microcomputer 101 performs the above described post-processing (see (h) in FIG. 10). When the post-processing is completed at timing t42, the output of the drive command SK is stopped in response to the transmission of the cut-off request signal SD (see (b) in FIG. 10). Also, at this timing t42, the timer counter 105a is cleared in accordance with the timer counter clear signal sent from the microcomputer 101, and the soak timer 105 starts clocking (see (d) in FIG. 10).

After that, when the count value of the timer counter 105a exceeds the start-up set time TH at timing t43 (see (d) in FIG. 10), the main relay 202 is controlled to the on state by the action of the soak timer 105, as a result of which the microcomputer 101 is applied with the operation voltage Vm (see (c) in FIG. 10). After the microcomputer 101 is started up in this way, the fault diagnosis processing on the evapo-purge system is performed (see (h) in FIG. 10). When this fault diagnosis processing is completed, the above described post-processing including communication with the soak timer 105 is performed at timing t44. As a result, the output of the drive command SK is stopped at timing t45 (see (b) in FIG. 10). However, if there is a fault in the main relay 202 at this moment, the attempt to drive the electric load 301 by outputting the drive command to the electric load drive circuit 302 is made (see (c) in FIG. 10), because the main relay 202 is kept at the on state irrespective of the stop of output of the drive command SK by the action of the soak timer 105 (see (e) in FIG. 10). At this time, the value of the voltage picked up at the external load terminal TM is stored in the CPU monitor RAM101b. The picked up voltage does not follow the drive command if there exists a breakage fault in the power supply path of the electric load 301 (see (f) in FIG. 10). Accordingly, it is diagnosed that the main relay 202 is in the state where it cannot be controlled to the off state, and there is also a breakage fault in the power supply path at timing t46 (see (g) in FIG. 10). The result of this diagnosis is written into the nonvolatile memory 102, and is notified to the vehicle passengers through illumination of the indicating lamp 108 (see (h) in FIG. 10). Although not shown in FIG. 10, the result of this diagnosis is also transmitted as a fail-safe command to other electronic control units connected to the in-vehicle network. It should be noted that when the ignition switch 201 is switched to the on position at timing t47, the microcomputer 101 starts performing the normal engine control after performing a specific initialization process (not shown) if the vehicle battery is in a condition to supply electric power. Although not shown in FIG. 10, a retry processing such as shown in FIG. 7 may be performed.

The above described electronic control unit according to the first embodiment of the invention provides advantages set forth below.

(1) The microcomputer 101 is configured to make an attempt to drive the electric load 301 utilizing the time period after transmission of the cut-off request signal commanding the main relay 202 to be turned off. If the electric load 301 is normally driven at this time, a diagnosis on the power supply path of the electric load 301 is made on the basis of the followability of the electric load 301 to the drive command. This enables a reliable fault diagnosis on the main relay 202 and its control line. This also makes it possible to diagnose the presence of a breakage fault in the power supply path concurrently with the presence of a fault in the main relay 202 or its control line, to thereby enhance the maintainability of the electronic control unit.

(2) The cut-off request signal SD produced by the microcomputer 101 is inputted to the main relay drive circuit 103 by way of the soak timer 105. Since the attempt to drive the electric load 301 is made when the cut-off request signal SD is not received by the main relay drive circuit 103 due to fault in the soak timer 105, it is possible to perform the fault diagnosis on the main relay 202 taking account of possibility of a fault existing in the soak timer 105.

(3) The microcomputer 101 is configured to make an attempt again (retry) to drive the electric load 301 utilizing the time period after transmission of the cut-off request signal SD followed by the attempt to drive the electric load 301. This further improves the reliability of the fault diagnosis.

(4) When it is diagnosed that there is a fault in the main relay 202, the result of this diagnosis is written into the nonvolatile memory 102, and is also notified to the vehicle passengers through illumination of the indicating lamp 108. This makes it possible for the vehicle driver to evacuate the vehicle to a nearby dealer shop or the like to avoid problems such as overdischarge of the vehicle battery. Furthermore, by refereeing to the contents of the nonvolatile memory 102, it is possible to early analyze the cause of the fault.

(5) Also, when it is diagnosed that there is a fault in the main relay 202, the result of this diagnosis is transmitted as a fail-safe command to other electronic control units connected in the in-vehicle network. This makes it possible for other electronic control units to perform appropriate fail-safe processings, for example, to prohibit performing some normal processings and performing specific processings on a preferential basis in order to ensure a high fail-safe ability of the entire vehicle.

(6) The microcomputer 101 itself monitors the elapsed time after it transmits the cut-off request signal SD. Accordingly, it is not necessary to provide a specific circuit for monitoring the elapsed time for performing the fault diagnosis on the main relay 202.

Second Embodiment

Next, an electronic control unit according to a second embodiment of the invention is described with reference to FIG. 11 to FIG. 15. The structure of the second embodiment is basically the same as that of the first embodiment. However, the second embodiment is configured to monitor the time elapsed since the microcomputer transmits the cut-off request signal, and to make an attempt to drive the electric load when the elapsed time exceeds a predetermined time.

The microcomputer 101 of the electronic control unit 100 of the second embodiment is added by a delay counter 101*d* shown by a dotted box (see FIG. 1). The microcomputer 101 is configured to monitor the elapsed time after transmission of the cut-off request signal SD through count up (increment) of the delay counter 101*d*, and to make an attempt to drive the electric load 301 when the count value of the delay counter 101*d* exceeds a set delay time (threshold time) DT to be explained later. The set delay time DT, which is prestored in the fault diagnosis section 101*a*, is set at a value corresponding to a sum of a response time needed for the main relay 202 to change to the off state in response to the cut-off request signal SD and a predetermined margin time.

Figure 11:
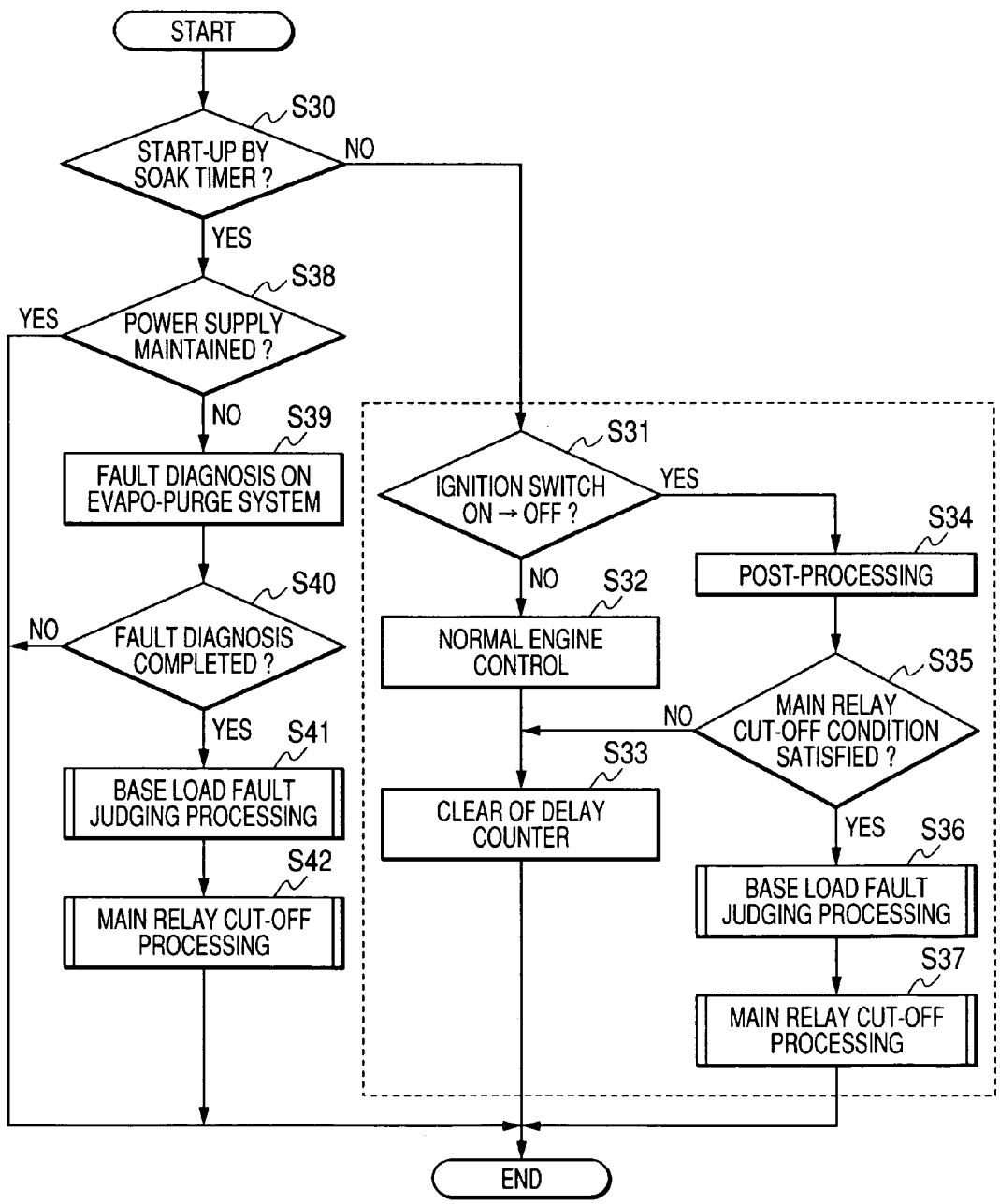
FIG. 11 is a flowchart showing processing steps of a control process performed by a microcomputer included in the electronic control unit according to a first embodiment of the invention.

Next, the control process performed by the microcomputer 101 is explained with reference to the flowchart shown in FIG. 11. The microcomputer 101 in this embodiment operates basically in the same way with the microcomputer 101 in the first embodiment. However, the microcomputer 101 in this embodiment is configured to increment and monitor the count value of the delay counter 101*d*, and to clear the delay counter 101*d* as necessary.

The control process begins by checking at step S30 whether or not the start up of the microcomputer 101 has been caused by the action of the soak timer 105. If it is determined at step S30 that the start up of the microcomputer 101 has not bee caused by the action of the soak timer 105, and it is determined at step S31 that the ignition switch 201 is maintained at the on state, the normal engine control is performed. In this embodiment, the delay counter 101*d* is cleared when the normal engine control is started (step S33). When the ignition switch 201 is switched to the off position (YES in step S31), the post-processing is performed at step S34, and then it is checked at step S35 whether or not main relay cut-off condition is satisfied. The delay counter 101*d* is cleared also in a case where it is determined at step S35 that the main relay cut-off condition is not satisfied. In this way, the count value of the delay counter 101*b* is cleared periodically during a period after the microcomputer 101 is started up by turning on the ignition switch 201 and before the main relay cut-off condition is satisfied. On the other hand, if is determined at step S35 that the main relay cut-off condition is satisfied, the base load fault judging processing is performed at step S36, and then a main relay cut-off processing (to be explained later) is performed at step S37 to complete the control process.

On the other hand, if it is determined at step S30 that the start-up of the microcomputer 101 has been caused by the action of the soak timer 105, it is checked at step S38 whether the microcomputer 101 has been started up in a state where the supply of electric power to the microcomputer 101 has been maintained. If it is determined at step S38 that the microcomputer 101 has been started up in a state where the supply of electric power has been maintained, the control process is ended. Otherwise, the fault diagnosis processing on the evapo-purge system is performed at step S39. After that, it is checked at step S40 whether or not the fault diagnosis processing on the evapo-purge system has been completed. If it is determined that the fault diagnosis processing on the evapo-purge system has been completed, the base load fault judging process is performed at step S41, and then the main relay cut-off processing is performed at step S42 to complete the control process.

Figure 12:
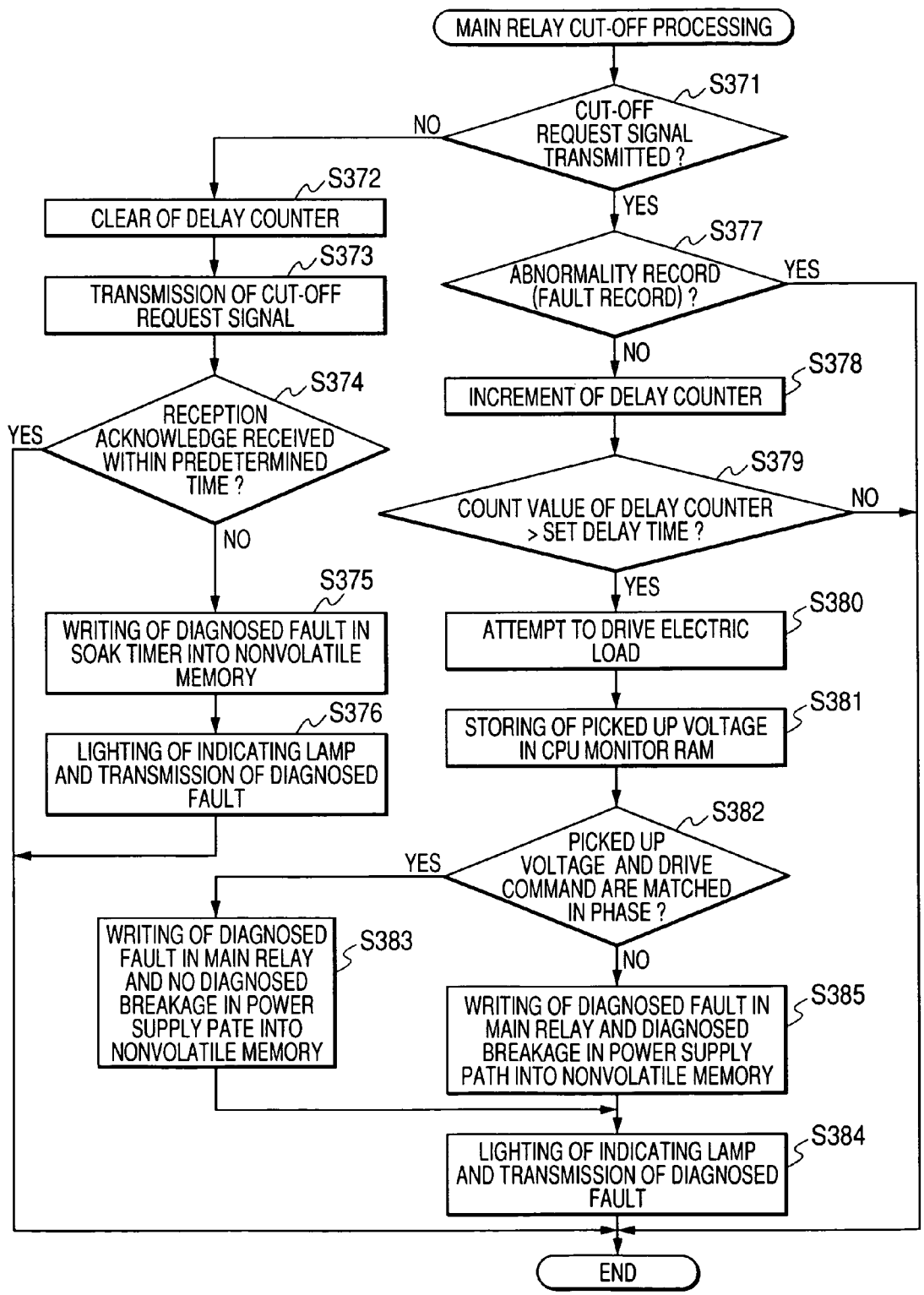
FIG. 12 is a flowchart showing steps of a main relay cut-off processing included in the control process performed by the microcomputer included in the electronic control unit according to the second embodiment of the invention.

Here, explanation is made to the main relay cut-off processing performed at step S37 and at step S42. As shown in FIG. 12, the main relay cut-off processing in this embodiment begins by checking at step S371 whether or not the cut-off request signal SD has been transmitted to the soak timer 105. If it is determined at step S371 that the cut-off request signal SD has not been transmitted to the soak timer 105, the count value of the delay counter 101*d* is cleared at step S372, and the cut-off request signal SD is transmitted from the communication section 101*c* at step S373. At this time, the timer counter clear signal is also transmitted.

Figure 4:
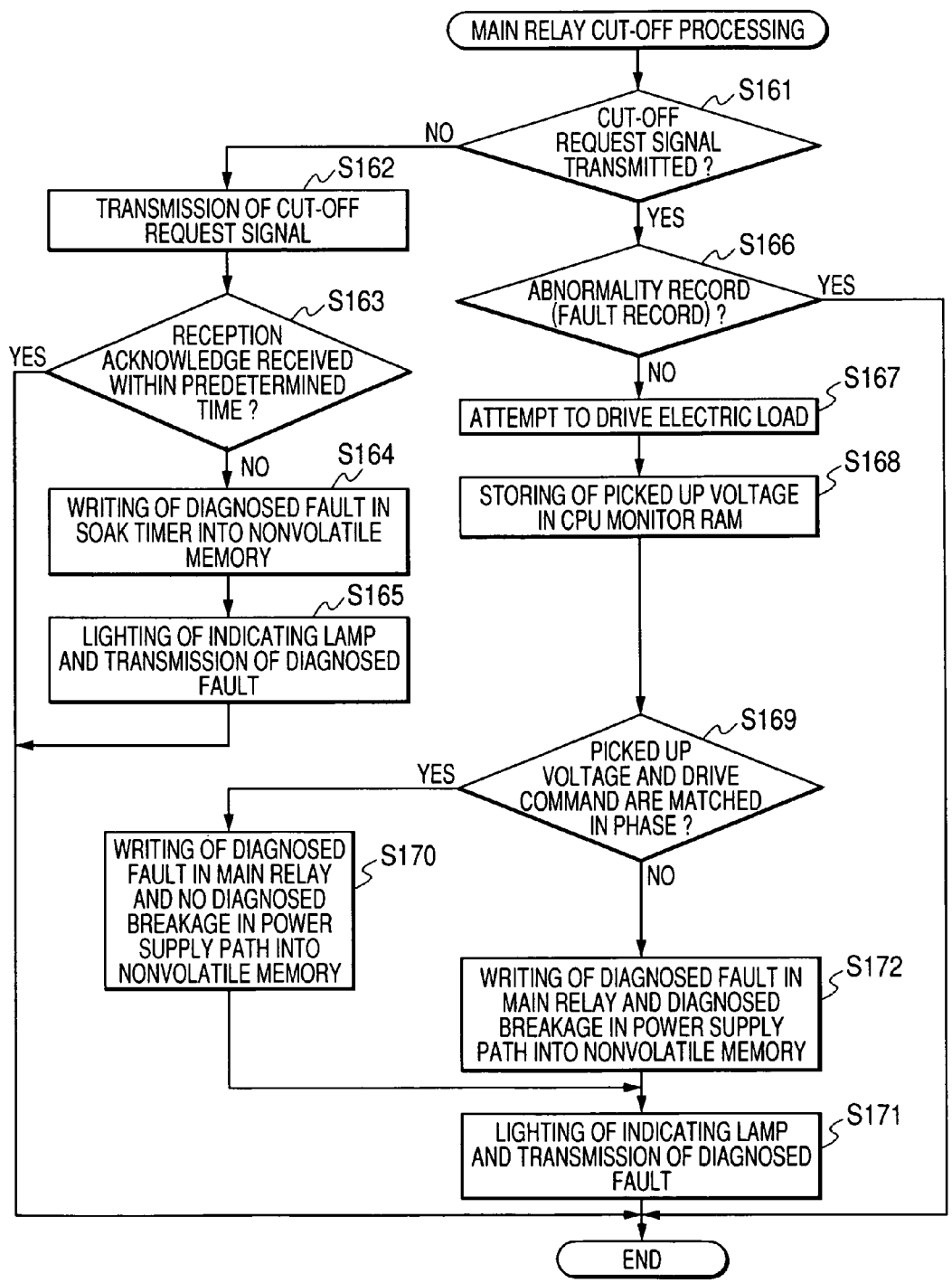
FIG. 4 is a flowchart showing steps of a main relay cut-off processing included in the control process performed by the microcomputer included in the electronic control unit according to the first embodiment of the invention.

After that, steps S374 to S376 equivalent to steps S163 to S165 shown in FIG. 4 are performed.

More specifically, it is checked whether or not there is abnormality in the soak timer 105 on the basis of the presence or absence of the reception acknowledge SR to be returned in response to the cut-off request signal SD. If it is determined that there is abnormality in the soak timer 105, the result of this check is written into the nonvolatile memory 102. After that, the result of this check is notified to the vehicle passengers through illumination of the indicating lamp 108, and is also transmitted as a fail-safe command.

In the case where the main relay 202 cannot be controlled to the off state even when the cut-off request signal SD is transmitted to the soak timer 105 due to abnormality in the main relay 202 or in its control line, the main relay cut-off processing continues even after transmission of the cut-off request signal SD, because the supply of electric power to the microcomputer 101 continues. In this case, since the transmission of the cut-off request signal SD has been already done, and accordingly the check result at step S371 becomes affirmative (YES), it is checked at step S377 whether or not the nonvolatile memory 102 stores a fault record (abnormality record). If it is determined that at step S377 that the nonvolatile memory 102 stores a fault record (abnormality record), the processing is ended for a time.

If it is determined that at step S377 that the nonvolatile memory 102 does not store a fault record (abnormality record), the delay counter 101*d* is incremented by one at step S378. Accordingly, also in this embodiment, the time elapsed since the microcomputer 101 transmitted the cut-off request signal SD is monitored on the basis of the count value of the delay counter 101*d* which is continuingly incremented.

After that, it is checked at step S379 whether or not the count value of the delay counter 101*d* exceeds the set delay time DT at step S379. It should be noted that, during a period in which the count value of the delay counter 101*d* is determined not to exceed the set delay time DT, the main relay cut-off processing is performed repeatedly as long as the supply of electric power to the microcomputer 101 is not interrupted. If it is determined at step S379 that the count value of the delay counter 101*d* exceeds the set delay time DT, that is, if it is determined that the supply of electric power to the microcomputer 101 is continuing, it is tried to drive the electric load 301 by outputting the drive command to the electric load drive circuit 302 at step S380. At this time, the value of a voltage picked up at the external load terminal TM is stored in the CPU monitor RAM101b at step S381.

After the pick-up of the voltage at the external load terminal TM is performed for a predetermined time, it is checked at step S382 whether or not the voltage picked up is following the drive command by comparing the phase of the voltage picked up with the phase of the drive command. If it is determined at step S382 that the voltage picked up is following the drive command, it is judged that there is not a break in the power supply path leading from the node (pick up point) between the electric load 301 and the electric load drive circuit 302 to the ground, or a fault in the power transistor of the electric load drive circuit 302. The result of this judgment is stored in the nonvolatile memory 102 at step S383. The result of this judgment is notified to the vehicle passengers through illumination of the indicating lamp 108, and is transmitted as a fail-safe command to other electronic units at step S384 to complete the main relay cut-off processing. On the other hand, if it is determined at step S382 that the voltage picked up is not following the drive command, it is judged at step S385 that there is a break in the electrical path, or a fault in the power transistor of the electric load drive circuit 302. The result of this judgment is notified to the vehicle passengers through illumination of the indicating lamp 108, and is transmitted as a fail-safe command to other electronic units at step S384 to complete the main relay cut-off processing.

Figure 13:
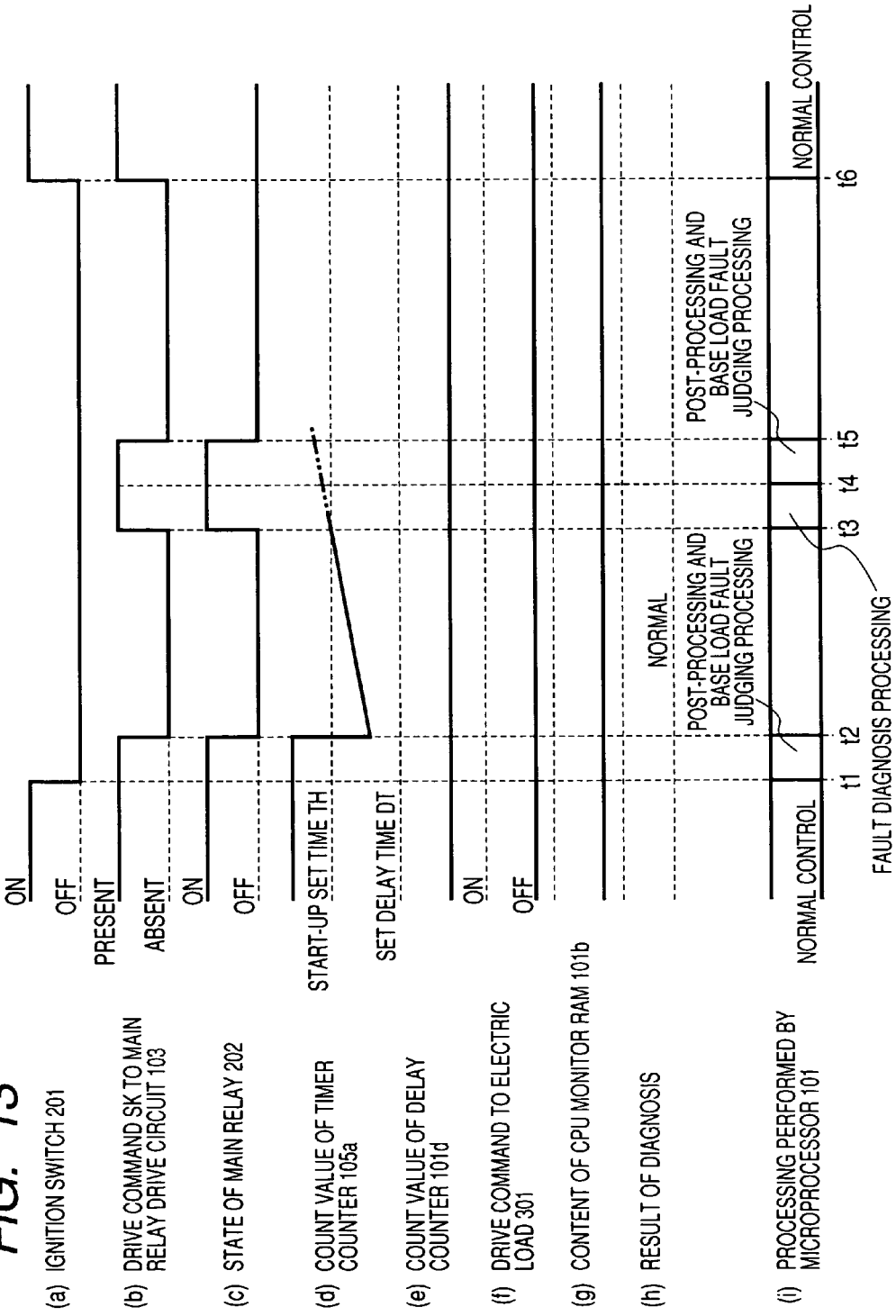
FIG. 13 is a timechart showing temporal changes of each signal and each part in the electronic control unit according to the second embodiment of the invention when an ignition switch is turned off.

Next, explanation is made on the temporal changes of each signal and each part of the electronic control unit of this embodiment when the ignition switch 201 is turned on with reference to the timechart shown in FIG. 13 for a case where there is no breakage in the power supply path, and there is no fault in the main relay 202 or in its control system, and the main relay 202 is in the state where it can be controlled to the off state.

As shown in the timechart of FIG. 13, when the ignition switch 201 is switched from the off position to the on position at timing t1, the microcomputer 101 performs the above described post-processing, base load fault judging processing, and communication with the soak timer 105 including transmission of the cut-off request signal SD (see (i) in FIG. 13). When the post-processing is completed at timing t2, the output of the drive command SK is stopped in response to the transmission of the cut-off request signal SD, as a result of which the main relay 202 is changed to the off state (see (b), (c) in FIG. 13). Also, at this timing t2, the timer counter 105a is cleared in accordance with the timer counter clear signal sent from the microcomputer 101, and the soak timer 105 starts clocking (see (d) in FIG. 13). It should be noted that the count value of the delay counter 101d is incremented very little, and therefore kept almost unchanged (see (e) in FIG. 13), because the microcomputer 101 enters the stopped state with the change of the main relay 202 to the off state. At this time, the electric load 301 is not driven (see (f) in FIG. 13), and a diagnosis that the main relay 202 is in the state where it can be normally controlled to the off state is made (see (h) in FIG. 13).

When the count value of the timer counter 105a exceeds the start-up set time TH at timing t3 (see (d) in FIG. 13), the main relay 202 is controlled to the on state by the action of the soak timer 105, as a result of which the microcomputer 101 is applied with the operation voltage Vm. After the microcomputer 101 is started up in this way, the fault diagnosis processing on the evapo-purge system is performed (see (i) in FIG. 13). When this fault diagnosis processing is completed at timing t4, the above described post-processing is performed at timing t5. As a result, the main relay 202 is changed to the off state in response to stop of output of the drive command SK to the main relay drive circuit 103 (see (b), (c) in FIG. 13), and the microcomputer 101 enters the stopped state again. Accordingly, also in this case, it is diagnosed that the main relay 202 is in the state that it can be normally controlled to the off state (see (h) in FIG. 13). It should be noted that when the ignition switch 201 is switched to the on state at timing t6, the microcomputer 101 starts performing a normal engine control after performing a specific initialization process (not shown).

Figure 14:
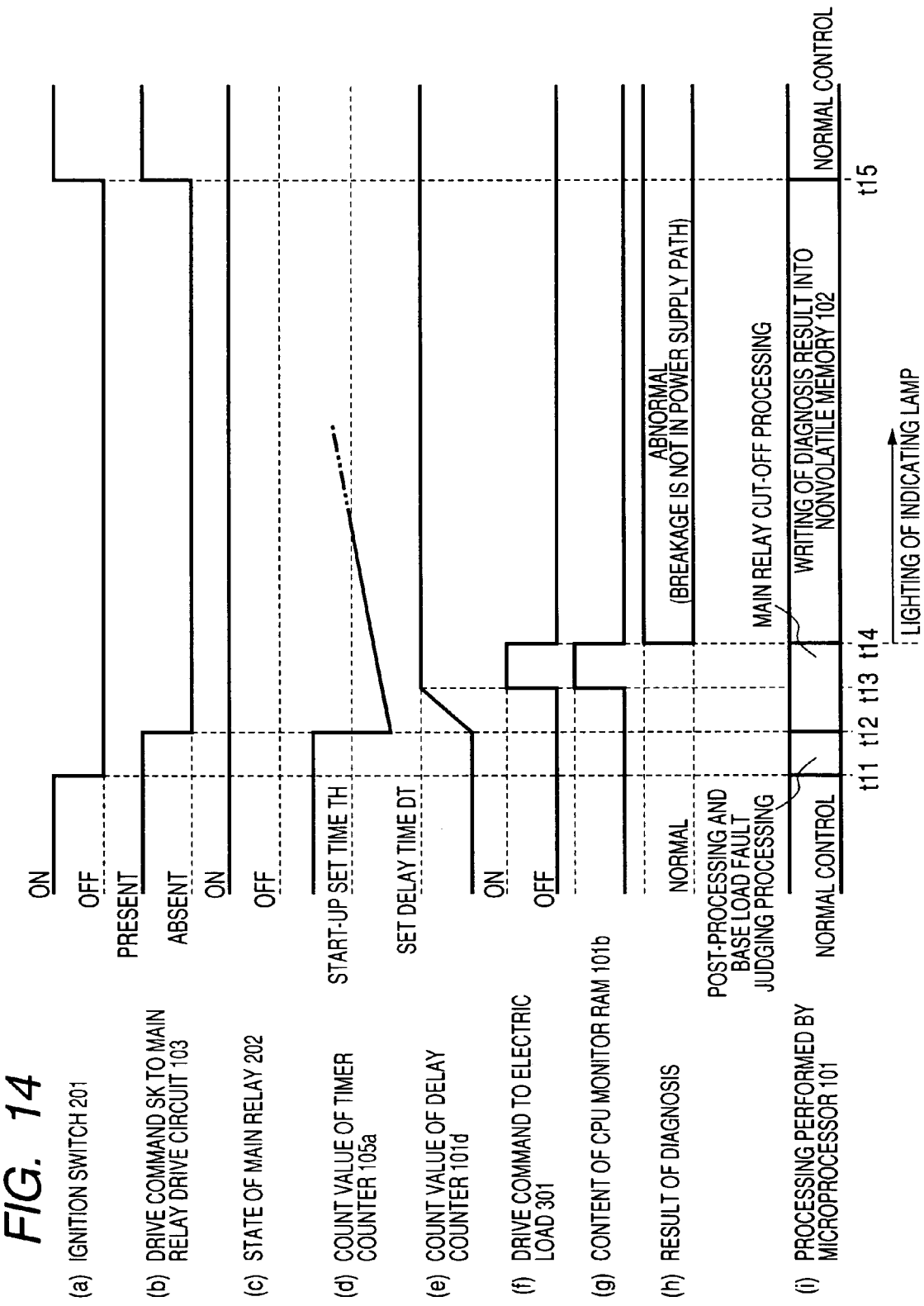
FIG. 14 is a timechart showing temporal changes of each signal and each part in the electronic control unit according to the second embodiment of the invention when the ignition switch is turned off.

Next, explanation is made on the temporal changes of each signal and each part of the electronic control unit of this embodiment when the ignition switch 201 is turned on with reference to the timechart shown in FIG. 14 for a case where there is no breakage in the power supply path, but there is a fault in the main relay 202 or in its control system when the ignition switch 201 is switched to the off position.

As shown in the timechart of FIG. 14, when the ignition switch 201 is switched from the on position to the off position at timing t11, the microcomputer 101 performs the above described post-processing (see (i) in FIG. 14). When the post-processing is completed at timing t12, the output of the drive command SK is stopped in response to the transmission of the cut-off request signal SD (see (b) in FIG. 14). Also, at this timing t12, the timer counter 105a is cleared in accordance with the timer counter clear signal sent from the microcomputer 101, and the soak timer 105 starts clocking (see (d) in FIG. 14). However, if there is a fault in the main relay 202 at this moment, the delay counter 101d is incremented (see (e) in FIG. 14), because the main relay 202 is kept at the on state irrespective of the stop of output of the drive command SK by the action of the soak timer 105 (see (c) in FIG. 14).

After that, when the count value of the delay counter 101d exceeds the set delay time DT at timing t13, the drive command is outputted to the electric load 301, and the voltage picked up at the external load terminal TM is stored in the CPU monitor RAM 101b (see (f) in FIG. 14). The picked up voltage follows the drive command as long as there exists no breakage fault in the power supply path of the electric load 301 (see (g) in FIG. 14). Accordingly, it is diagnosed that the main relay 202 is in the state where it cannot be controlled to the off state, although there exists no breakage fault in the power supply path at timing t14 (see (i) in FIG. 14). The result of this diagnosis is written into the nonvolatile memory 102, and is notified to the vehicle passengers through illumination of the indicating lamp 108 (see (i) in FIG. 14). Although not shown in FIG. 14, the result of this diagnosis is also transmitted as a fail-safe command to other electronic control units connected to the in-vehicle network. It should be noted that when the ignition switch 201 is switched to the on position at timing t15, the microcomputer 101 starts performing the normal engine control after performing a specific initialization process (not shown) if the vehicle battery is in a condition to supply electric power.

Figure 15:
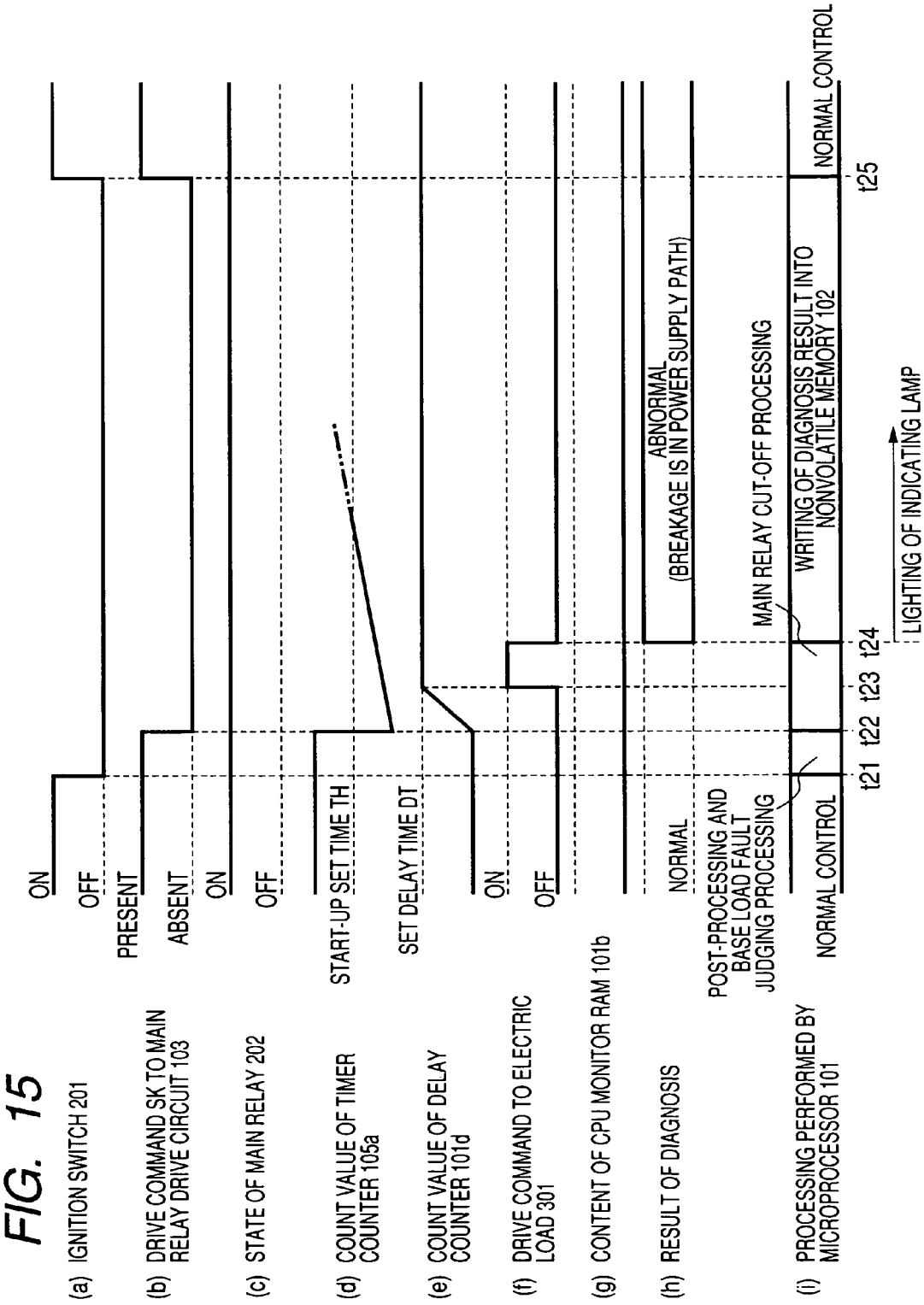
FIG. 15 is a timechart showing temporal changes of each signal and each part in the electronic control unit according to the second embodiment of the invention when an ignition switch is turned off.

Next, explanation is made on the temporal changes of each signal and each part of the electronic control unit of this embodiment when the ignition switch 201 is turned on with reference to the timechart shown in FIG. 15 for a case where there is a breakage in the power supply path, and there occurs a fault in the main relay 202 or in its control system when the ignition switch is switched to the off position.

As shown in the timechart of FIG. 15, when the ignition switch 201 is switched from the on position to the off position at timing t21, the microcomputer 101 performs the above described post-processing (see (i) in FIG. 15). When the post-processing is completed at timing t22, the output of the drive command SK is stopped in response to the transmission of the cut-off request signal SD (see (b) in FIG. 15). Also, at this timing t22, the timer counter 105a is cleared in accordance with the timer counter clear signal sent from the microcomputer 101, and the soak timer 105 starts clocking (see (d) in FIG. 15). However, if there is a fault in the main relay 202 at this moment, the delay counter 101d is incremented (see (e) in FIG. 15).

After that, when the count value of the delay counter 101d exceeds the set delay time DT, the drive command is outputted to the electric load 301, and the voltage picked up at the external load terminal TM is stored in the CPU monitor RAM 101b (see (f) in FIG. 15). When there is a fault in the power supply path of the electric load 301, the picked up voltage stored in the CPU monitor RAM 101b does not have an expected normal value. That is, when there is a fault in the power supply path of the electric load 301, the picked up voltage does not follow the drive command. Accordingly, it is diagnosed that the main relay 202 is in the state where it cannot be controlled to the off state, and there is also a breakage fault in the power supply path at timing t24 (see (h) in FIG. 15). The result of this diagnosis is written into the nonvolatile memory 102, and is notified to the vehicle passengers through illumination of the indicating lamp 108 (see (i) in FIG. 15). Although not shown in FIG. 15, the result of this diagnosis is also transmitted as a fail-safe command to other electronic control units connected to the in-vehicle network. It should be noted that when the ignition switch 201 is switched to the on position at timing t25, the microcomputer 101 starts performing the normal engine control after performing a specific initialization process (not shown) if the vehicle battery is in a condition to supply electric power.

The temporal changes of each signal and each part of the electronic control unit of this embodiment in a case where there occurs a fault in the main relay 202 after the microcomputer 101 is started up by the action of the soak timer 105 are similar to those in the above described cases explained with reference to the timecharts shown in FIG. 14 and FIG. 15. Also in this case, the delay counter 101d is incremented after the microcomputer 101 outputs the cut-off request signal SD during performing the post-processing. Thereafter, when the count value of the delay counter 101d exceeds the set delay time DT, an attempt to drive the electric load 301 is made, and the voltage picked up at the external load terminal TM is stored in the CPU monitor RAM. Subsequently, the fault diagnosis on the main relay 202 and the diagnosis of presence of a breakage fault on the power supply path of the electric load 301 are performed concurrently. If it is diagnosed that the main relay is in the state where it cannot be controlled to the off state, the result of this diagnosis is written into the nonvolatile memory 102, notified to the vehicle passengers through illumination of the indicating lamp 108, and transmitted as a fail-safe command to other electronic control units connected to the in-vehicle network.

As explained above, the electronic control unit of the second embodiment provides the following advantages in addition the advantages (1) to (6) provided by the electronic control unit of the first embodiment.

(7) The time elapsed since the microcomputer 101 transmits the cut-off signal SD is monitored through the increment of the delay counter 101d, and an attempt to drive the electric load 301 is made when the monitored elapsed time exceeds the set delay time DT. This makes it possible to allow for the main relay 202 to be in a temporal fault state due to contact sticking thereof, to further improve the reliability of the fault diagnosis on the main relay 202.

(8) The set delay time DT is set at a value corresponding to a sum of a response time needed for the main relay 202 to change to the off state in response to the cut-off request signal SD and a predetermined margin time. This makes it possible to absorb the variation of the response time, to thereby still further improve the reliability of the fault diagnosis on the main relay 202.

It is a matter of course that various modifications can be made to the above described embodiments as described below.

Although the elapsed time after transmission of the cut-off request signal SD from the microcomputer 101 is monitored through increment of the delay counter 101d in the second embodiment, the elapsed time may be monitored by a separately provided timer IC.

In the above described embodiments, the diagnosis on the presence of a breakage fault in the power supply path is performed on the basis of the followability of the voltage at the ground terminal of the electric load 301. However, they may be so configured to measure a current flowing through the electric load 301 by use of a shunt resistor or the like, and to perform the diagnosis on the presence of a breakage fault in the power supply path on the basis of the measured current when the electric load 301 is normally driven by the attempt to drive the electric load 301 is made.

The stop command SH may be directly supplied from the microcomputer 101 to the main relay drive circuit 103 as shown by the broken line in FIG. 1, instead of the microcomputer 101 outputting the cut-off request signal SD to the soak timer 105, and the soak timer 105 outputting the stop command SH to the main relay drive circuit 103.

The breakage fault diagnosis on the power supply path of the electric load 301 may be made on the basis of the level of the voltage picked up at the external load terminal TM when the electric load 301 is normally driven by the attempt to drive the electric load 301 is made. In this case, the base load fault judging processing can be removed.

The fault diagnosis on the main relay 202 is performed on the basis of whether the electric load 301 is normally driven when the attempt to drive the electric load 301 is made after the microcomputer 101 transmits the cut-off request signal in the above described embodiments. However, the electronic control unit 100 may be so configured to monitor the voltage applied to the electric load 301 after the microcomputer 101 transmits the cut-off request signal SD, and to make the fault diagnosis on the main relay 202 on the basis of whether or not the monitored voltage is equal to a voltage to be applied to the electric load 301 when the main relay 202 is in the on state. That is because, since the voltage applied to the electric load 301 and the resistance value thereof change depending on whether the main relay 202 is in the on state or the off state, it is possible to diagnose whether or not the main relay 202 is in the fault state where it cannot be controlled to the off state.

Figure 16:
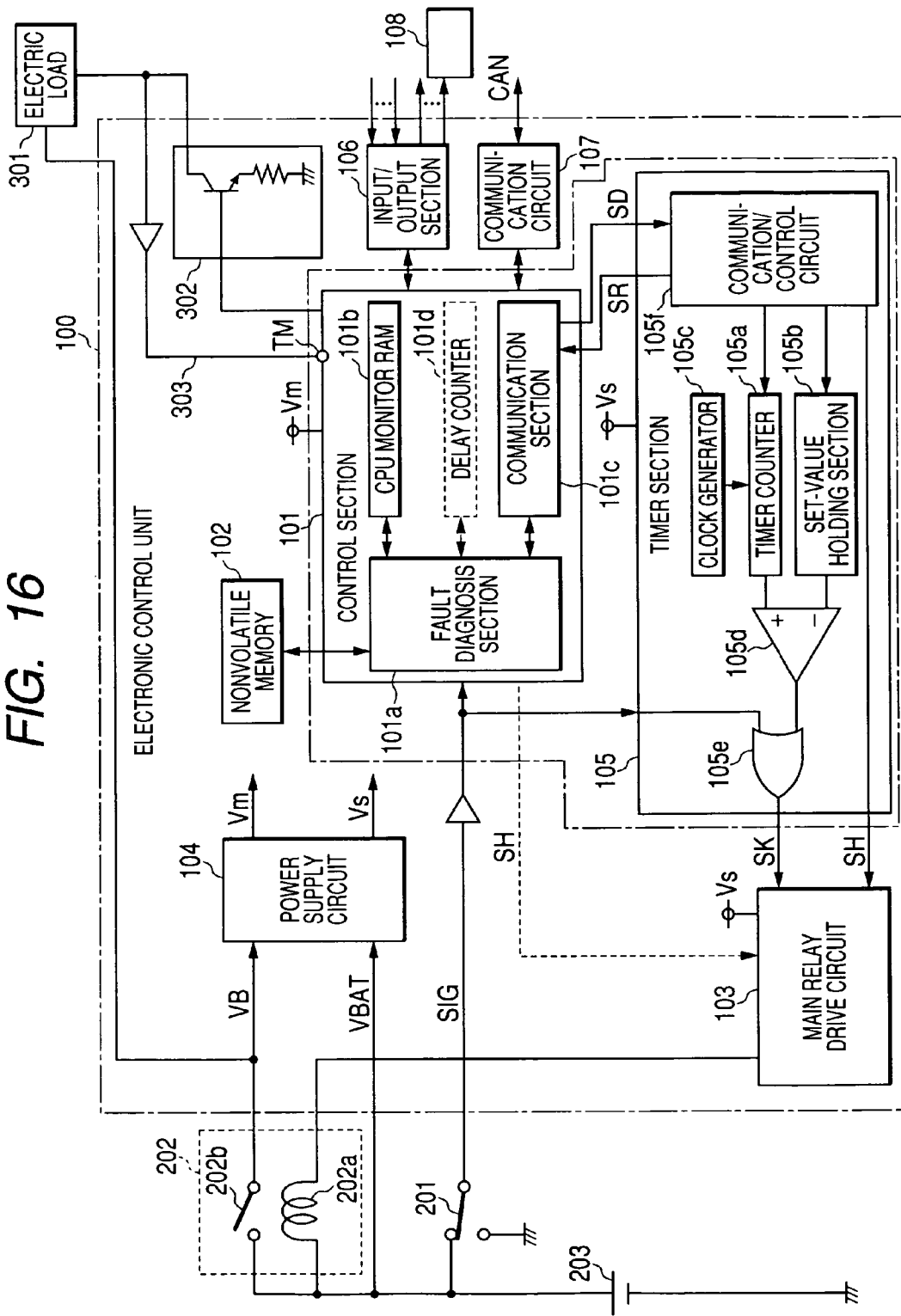
FIG. 16 is a block diagram showing a structure of a variant of the electronic control unit according to the first embodiment of the invention.

In the above described embodiments, the microcomputer and the soak timer are separately formed in different IC chips, however they may be integrated in the same IC chip (microcomputer chip) as a control section and a timer section, respectively, as shown in FIG. 16.

The above explained preferred embodiments are exemplary of the invention of the present application which is described solely by the claims appended below. It should be understood that modifications of the preferred embodiments may be made as would occur to one of skill in the art.

What is claimed is:

1. A method of diagnosing presence of a fault in a main relay by use of an electronic control unit including a control section monitoring a manipulation of an ignition switch of a vehicle, and a timer section for automatically starting up said control section, said electronic control unit being configured to control said main relay to an on state for supplying said control section with electric power from a vehicle battery when said ignition switch is turned on or when said timer section in which a predetermined start-up set time is set is timed up, and to control said main relay to an off state in accordance with a stop command outputted from said control section, said method comprising the steps of:
monitoring, by use of said control section, a state of an electric load connected to said electronic control unit and supplied with electric power from said vehicle battery when said main relay is in the on state after said control section outputs said stop command; and
diagnosing whether or not said main relay is in a fault state where said main relay cannot be controlled from the on state to the off state on the basis of monitored state of said electric load.

2. The method according to claim 1, wherein said monitoring step includes making an attempt to drive said electric load by use of said control section to monitor operation state of said electric load when said attempt is made.

3. The method according to claim 2, wherein said stop command outputted from said control section is inputted to a drive circuit of said main relay by way of said timer section, and said attempt is made utilizing a time period after transmission of said stop command from said control section to said timer section.

4. The method according to claim 2, wherein said stop command outputted from said control section is directly inputted to a drive circuit of said main relay, and said attempt is made utilizing a time period after transmission of said stop command from said control section to a drive circuit of said main relay.

5. The method according to claim 4, wherein said monitoring step further including, if said electric load is normally driven when said attempt is made, making said attempt for the second time, and said diagnosing step including determining that said main relay is in said fault state if said electric load is normally driven when said attempt is made for the second time.

6. The method according to claim 2, further comprising the step of making, if said electric load is normally driven when said attempt is made, a diagnosis of presence of a breakage fault in a power supply path of said electric load on the basis of followability of said electric load to said drive command.

7. The method according to claim 2, further comprising the step of making, if said electric load is normally driven when said attempt is made, a diagnosis of presence of a breakage fault in a power supply path of said electric load on the basis of a value of a current flowing into said electric load through said power supply path.

8. The method according to claim 2, wherein said monitoring step includes monitoring a time elapsed since said control section transmits said stop command by use of said control section, said attempt being made when said monitored elapsed time exceeds a threshold time set at a value determined depending on a response time needed for said main relay to change from the on state to the off state in response to said stop command.

9. The method according to claim 8, wherein said threshold time is equal to a sum of said response time and a predetermined margin time.

10. The method according to claim 1, further comprising the step of, when a diagnosis that said main relay is in said fault state, notifying a result of said diagnosis, and storing said result of said diagnosis in a nonvolatile memory included in said electronic control unit.

11. The method according to claim 1, wherein said control section and said timer section are separately formed in different IC chips.

12. The method according to claim 1, wherein said control section and said timer section are integrated in the same IC chip.

13. An electronic control unit comprising:
a control section monitoring a manipulation of an ignition switch of a vehicle; and
a timer section for automatically starting up said control section;
said electronic control unit being configured to control said main relay to an on state for supplying said control section with electric power from a vehicle battery when said ignition switch is turned on or when said timer section in which a predetermined start-up set time is set is timed up, and to control said main relay to an off state in accordance with a stop command outputted from said control section, and being provided with a fault diagnosis function of monitoring, by use of said control section, a state of an electric load connected to said electronic control unit and supplied with electric power from said vehicle battery when said main relay is in the on state after said control section outputs said stop command, and diagnosing whether or not said main relay is in a fault state where said main relay cannot be controlled from the on state to the off state on the basis of monitored state of said electric load.

14. The electronic control unit according to claim 13, wherein said fault diagnosis function is configured to make an attempt to drive said electric load by use of said control section to monitor an operation state of said electric load when said attempt is made.

15. The electronic control unit according to claim 13, wherein said stop command outputted from said control section is inputted to a drive circuit of said main relay by way of said timer section, and said fault diagnosis function is configured to make said attempt utilizing a time period after transmission of said stop command from said control section to said timer section.

16. The electronic control unit according to claim 14, wherein said stop command outputted from said control section is directly inputted to a drive circuit of said main relay, and said fault diagnosis function is configured to make said attempt utilizing a time period after transmission of said stop command from said control section to a drive circuit of said main relay.

17. The electronic control unit according to claim 16, wherein said fault diagnosis function is configured to make, if said electric load is normally driven when said attempt is made, said attempt for the second time, and to determine that said main relay is in said fault state if said electric load is normally driven when said attempt is made for the second time.

18. The electronic control unit according to claim 14, wherein said fault diagnosis function is configured to make, if said electric load is normally driven when said attempt is made, a diagnosis of presence of a breakage fault in a power supply path of said electric load on the basis of followability of said electric load to said drive command.

19. The electronic control unit according to claim 14, wherein said fault diagnosis function is configured to make, if said electric load is normally driven when said attempt is made, a diagnosis of presence of a breakage fault in a power supply path of said electric load on the basis of a value of a current flowing into said electric load through said power supply path.

20. The electronic control unit according to claim 14, wherein said fault diagnosis function is configured to monitor a time elapsed since said control section transmits said stop command by use of said control section, said attempt being made when said monitored elapsed time exceeds a threshold time set at a value determined depending on a response time needed for said main relay to change from the on state to the off state in response to said stop command.

21. The electronic control unit according to claim 20, wherein said threshold time is equal to a sum of said response time and a predetermined margin time.

22. The electronic control unit according to claim 13, wherein said fault diagnosis function is configured to, when a diagnosis that said main relay is in said fault state is made, notify a result of said diagnosis, and store said result of said diagnosis in a nonvolatile memory included in said electronic control unit.

23. The electronic control unit according to claim 13, wherein said fault diagnosis function is configured to, when a diagnosis that said main relay is in said fault state is made, transmit a result of said diagnosis as a fail-safe command to other electronic control units through an in-vehicle network.

24. The electronic control unit according to claim 13, wherein said control section and said timer section are separately formed in different IC chips.

25. The electronic control unit according to claim 13, wherein said control section and said timer section are integrated in the same IC chip.

* * * * *